(12) United States Patent
Seo et al.

(10) Patent No.: US 10,892,390 B2
(45) Date of Patent: Jan. 12, 2021

(54) LIGHT-EMITTING ELEMENT AND LIGHT-EMITTING ELEMENT PACKAGE INCLUDING THE SAME

(71) Applicant: LG INNOTEK CO., LTD., Seoul (KR)

(72) Inventors: Jae Won Seo, Seoul (KR); Sang Youl Lee, Seoul (KR); Woo Sik Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 6 days.

(21) Appl. No.: 16/075,490

(22) PCT Filed: Feb. 3, 2017

(86) PCT No.: PCT/KR2017/001229
§ 371 (c)(1),
(2) Date: Aug. 3, 2018

(87) PCT Pub. No.: WO2017/135763
PCT Pub. Date: Aug. 10, 2017

(65) Prior Publication Data
US 2019/0051801 A1    Feb. 14, 2019

(30) Foreign Application Priority Data

Feb. 5, 2016  (KR) .......................... 10-2016-0015149
Feb. 16, 2016 (KR) .......................... 10-2016-0017631

(51) Int. Cl.
*H01L 33/62*       (2010.01)
*H01L 33/42*       (2010.01)
(Continued)

(52) U.S. Cl.
CPC .............. *H01L 33/62* (2013.01); *H01L 33/10* (2013.01); *H01L 33/325* (2013.01); *H01L 33/38* (2013.01);
(Continued)

(58) Field of Classification Search
CPC ....... H01L 33/62; H01L 33/325; H01L 33/10; H01L 33/38; H01L 33/46;
(Continued)

(56) References Cited

U.S. PATENT DOCUMENTS

2011/0316037 A1   12/2011  Kamei et al.
2012/0146045 A1*  6/2012   Sugiyama ............... H01L 33/06
                                                       257/76
(Continued)

FOREIGN PATENT DOCUMENTS

JP       2010-147097 A    7/2010
JP       2012-19140 A     1/2012
(Continued)

*Primary Examiner* — Steven H Loke
*Assistant Examiner* — Juanita B Rhodes
(74) *Attorney, Agent, or Firm* — Birch, Stewart, Kolasch & Birch, LLP

(57) ABSTRACT

A light-emitting element according to an embodiment comprises: a light-emitting structure including a first conductive type semiconductor layer, a second conductive type semiconductor layer, and an active layer formed between the first and second conductive type semiconductor layers; a reflective layer formed on the second conductive type semiconductor layer; a capping layer formed on the reflective layer to surround the reflective layer; a first electrode electrically connected with the first conductive type semiconductor layer; a first bonding pad electrically connected with the first electrode; and a second bonding pad electrically connected with the second electrode, wherein the light-emitting structure includes a recess extending to a region of the first conductive type semiconductor layer through the second conductive type semiconductor layer and the active layer; the first electrode is formed within the recess and electrically connected with the first conductive type semiconductor layer, and includes a region bent along a side surface of the (Continued)

second bonding pad; the reflective layer is formed to be spaced apart from the recess; and the capping layer includes a transparent electrode.

18 Claims, 17 Drawing Sheets

(51) Int. Cl.
    *H01L 33/38*     (2010.01)
    *H01L 33/40*     (2010.01)
    *H01L 33/10*     (2010.01)
    *H01L 33/46*     (2010.01)
    *H01L 33/32*     (2010.01)
    *H01L 33/22*     (2010.01)

(52) U.S. Cl.
    CPC .......... *H01L 33/382* (2013.01); *H01L 33/405* (2013.01); *H01L 33/42* (2013.01); *H01L 33/22* (2013.01); *H01L 33/46* (2013.01); *H01L 2933/0016* (2013.01); *H01L 2933/0025* (2013.01); *H01L 2933/0066* (2013.01)

(58) Field of Classification Search
    CPC ..... H01L 2933/0016; H01L 2933/0025; H01L 2933/0066; H01L 33/382; H01L 33/405; H01L 33/42; H01L 33/22
    See application file for complete search history.

(56) References Cited

U.S. PATENT DOCUMENTS

| | | | |
|---|---|---|---|
| 2012/0199868 A1 | 8/2012 | Inoue et al. | |
| 2012/0241760 A1* | 9/2012 | Okabe | H01L 33/38 257/76 |
| 2013/0113012 A1 | 5/2013 | Shinohara et al. | |
| 2013/0119424 A1* | 5/2013 | Kang | H01L 33/62 257/98 |
| 2014/0361327 A1 | 12/2014 | Chae et al. | |
| 2015/0207051 A1* | 7/2015 | Yoon | H01L 33/14 362/382 |
| 2015/0333230 A1* | 11/2015 | Moon | H01L 27/156 257/88 |
| 2016/0111600 A1* | 4/2016 | Chae | H01L 33/38 257/99 |
| 2016/0343914 A1* | 11/2016 | Jeon | H01L 33/405 |

FOREIGN PATENT DOCUMENTS

| | | |
|---|---|---|
| JP | 2012-164782 A | 8/2012 |
| KR | 10-2015-0093493 A | 8/2015 |
| KR | 10-2015-0009098 A | 1/2016 |
| WO | WO2015190722 A1 * 12/2015 | ........... H01L 33/382 |

* cited by examiner

[FIG. 1]
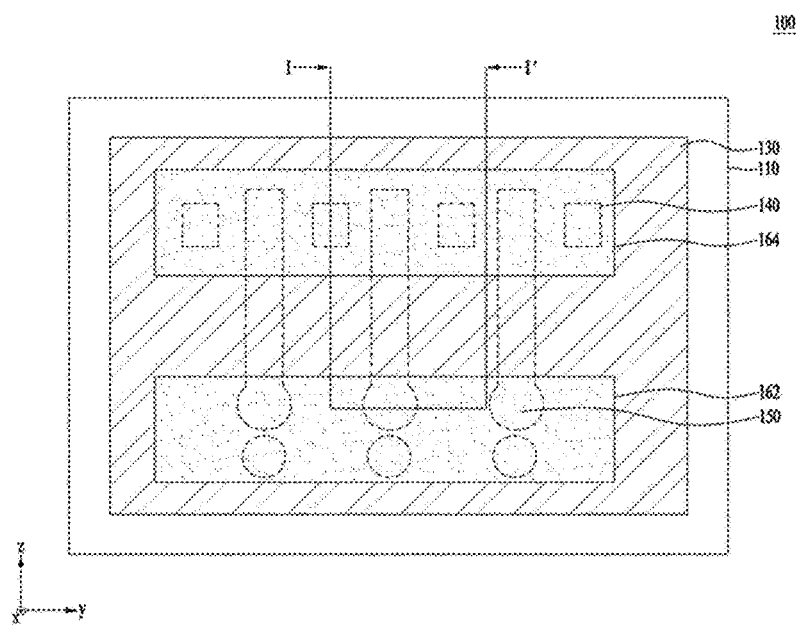

[FIG. 2A]
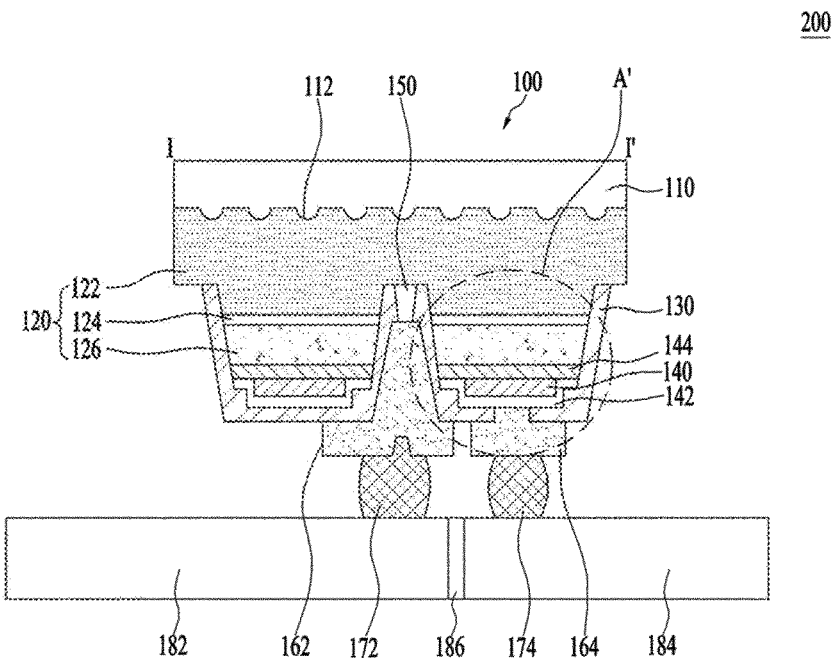
[FIG. 2B]
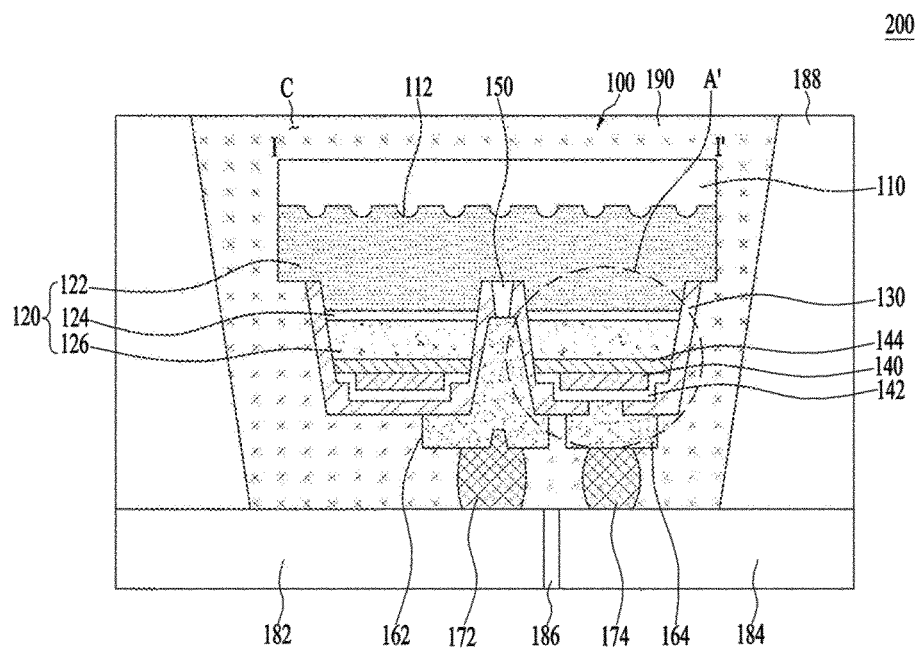

[FIG. 3A]
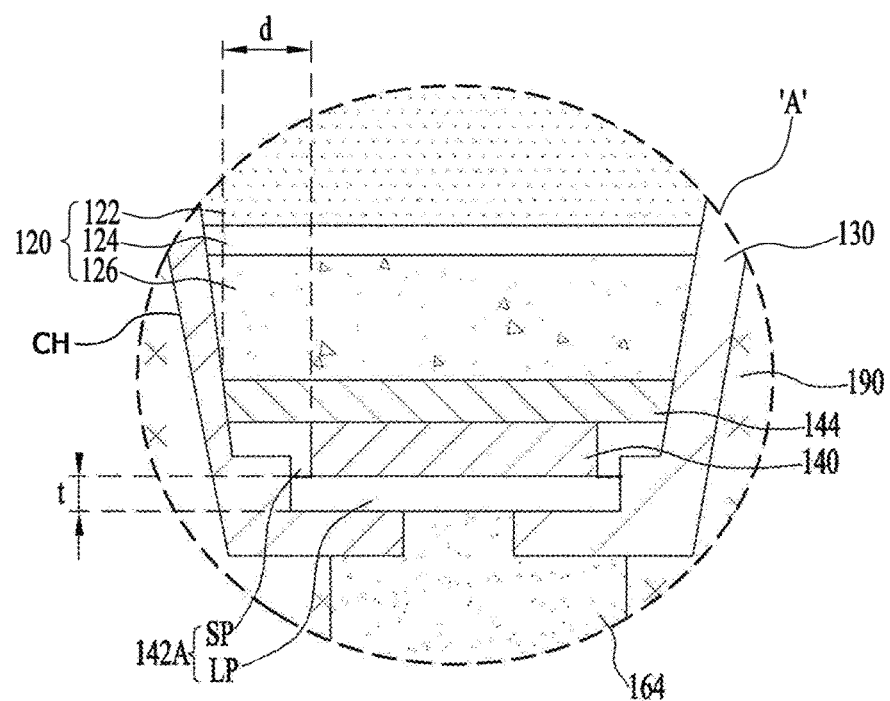

[FIG. 3B]
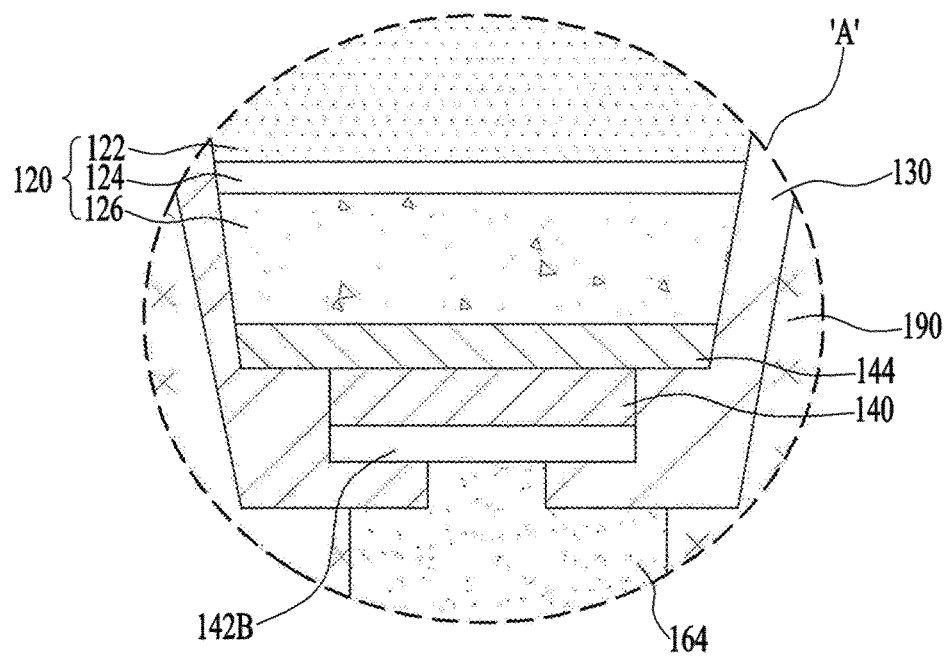
[FIG. 4]
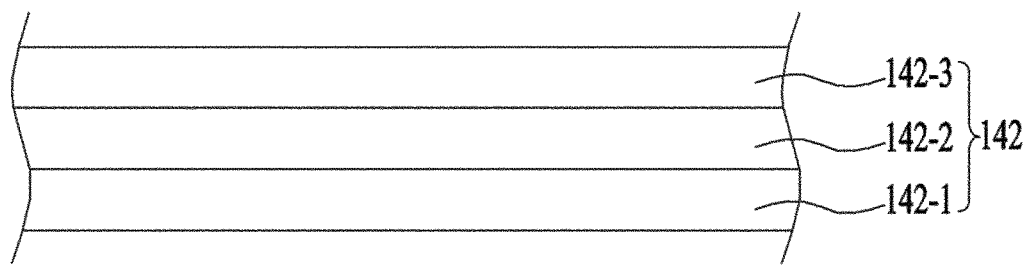

[FIG. 5]
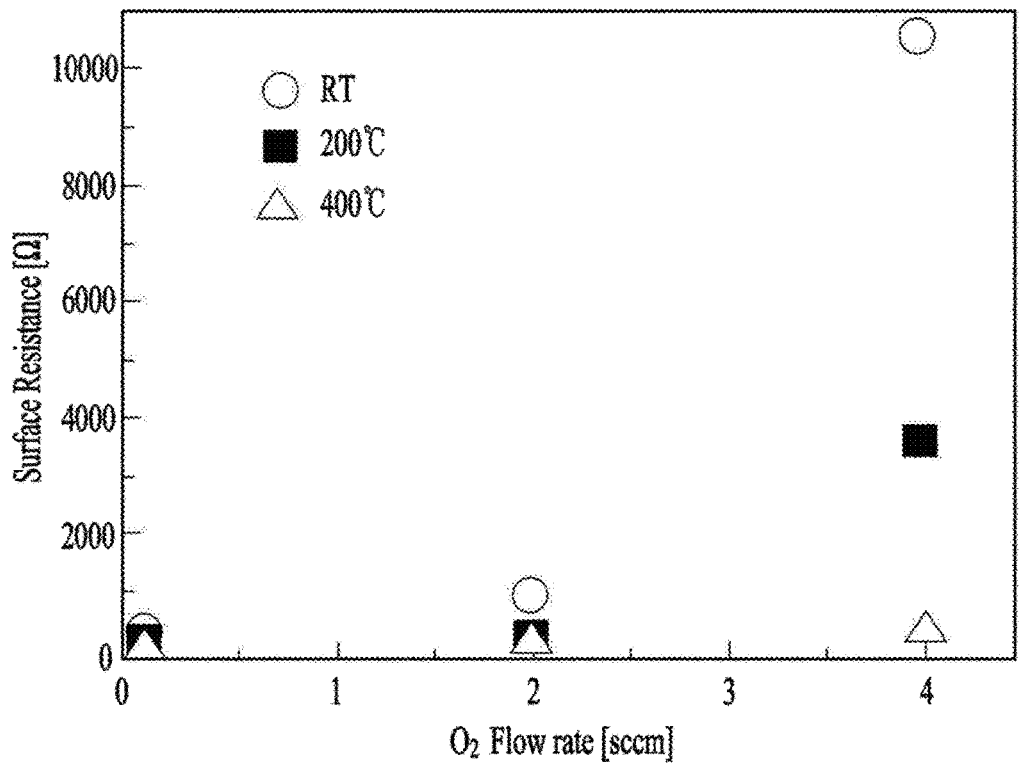
[FIG. 6A]
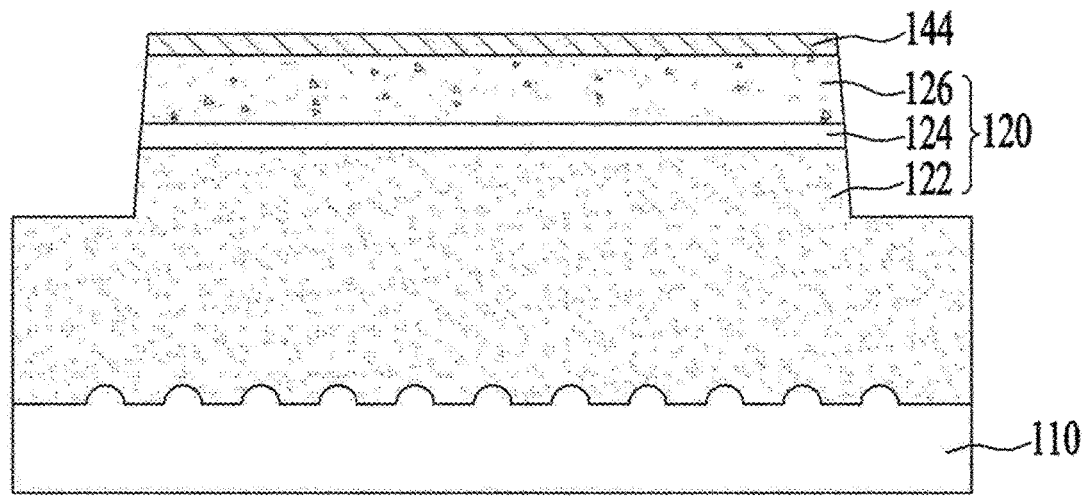

[FIG. 6B]
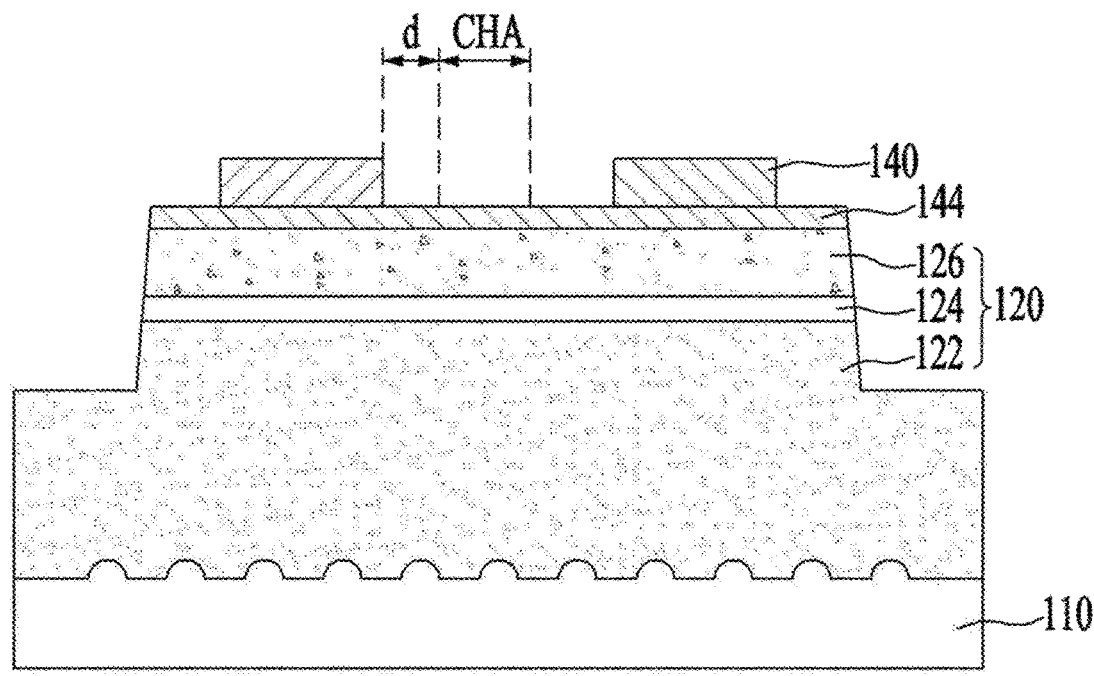

[FIG. 6C]
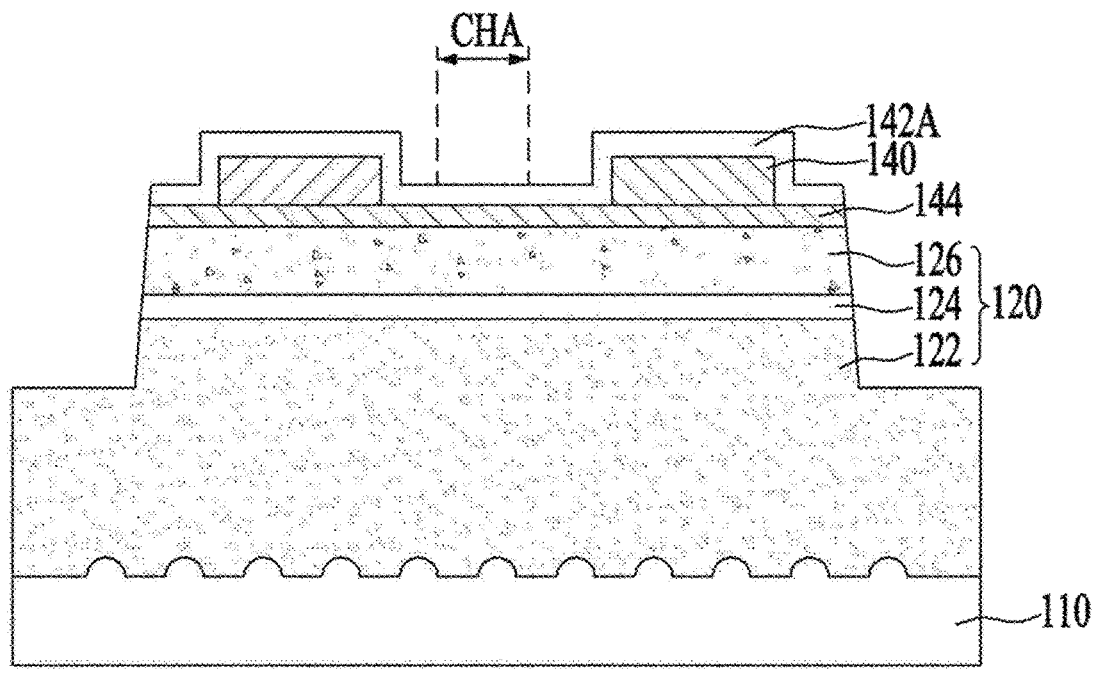

[FIG. 6D]
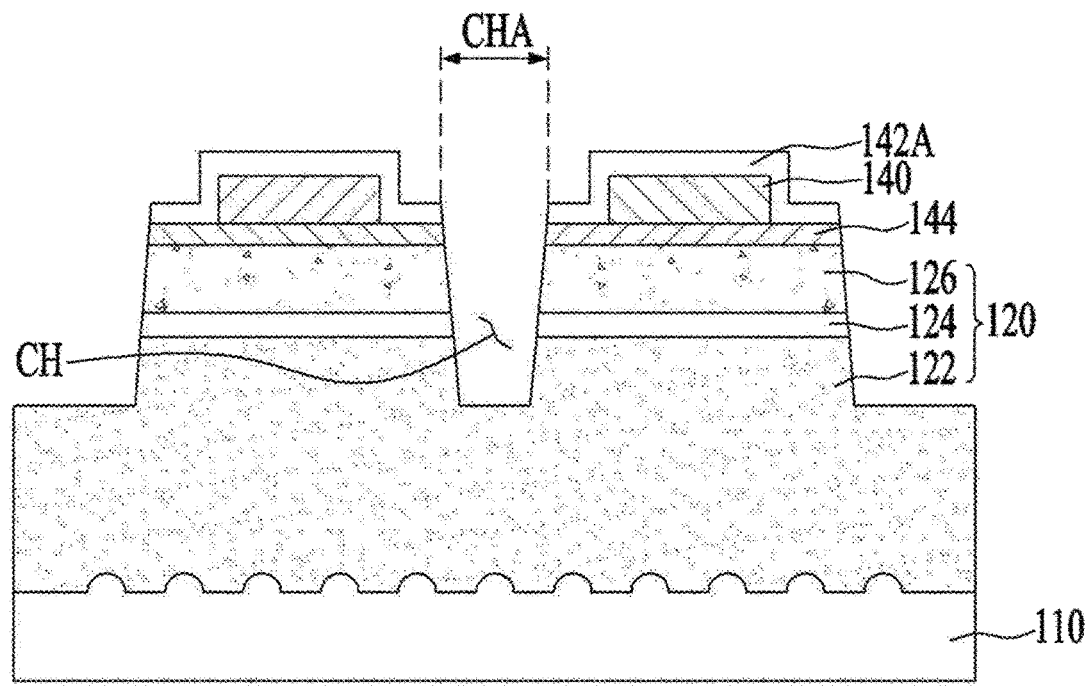

[FIG. 6E]
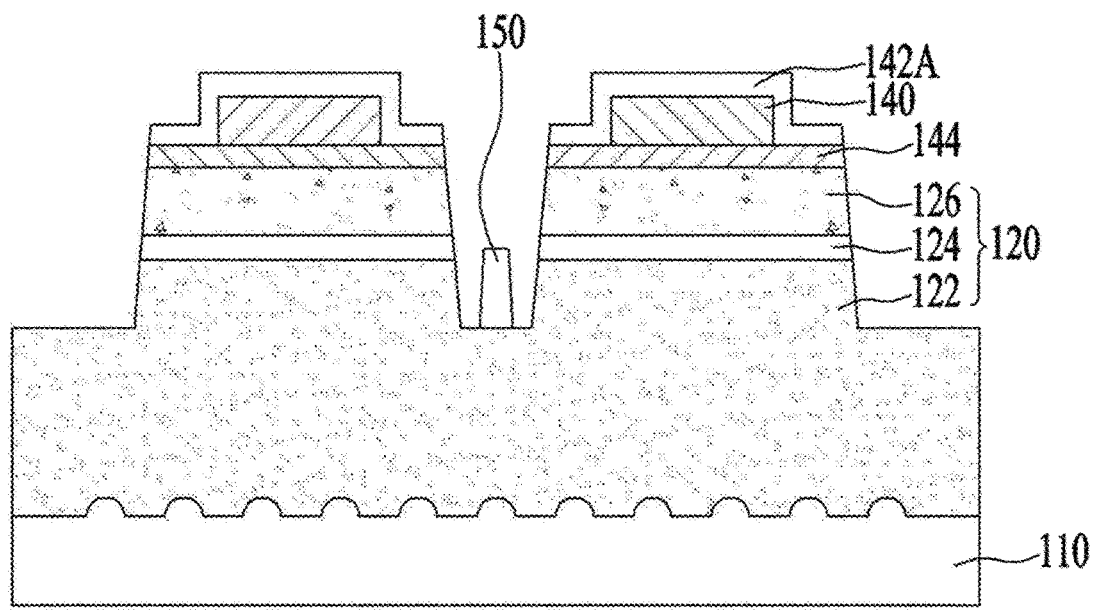
[FIG. 7A]
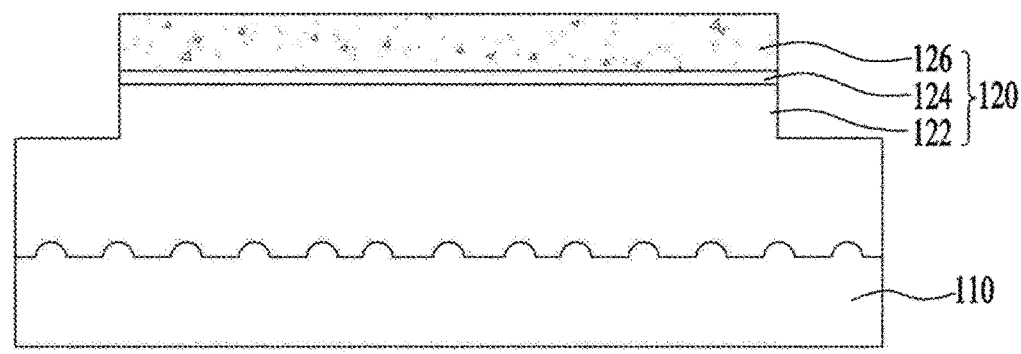

[FIG. 7B]
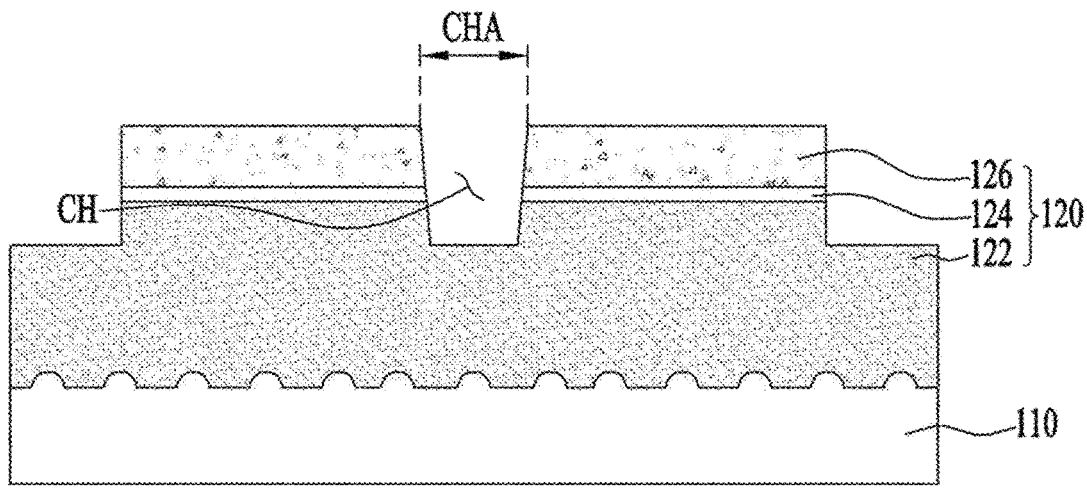
[FIG. 7C]
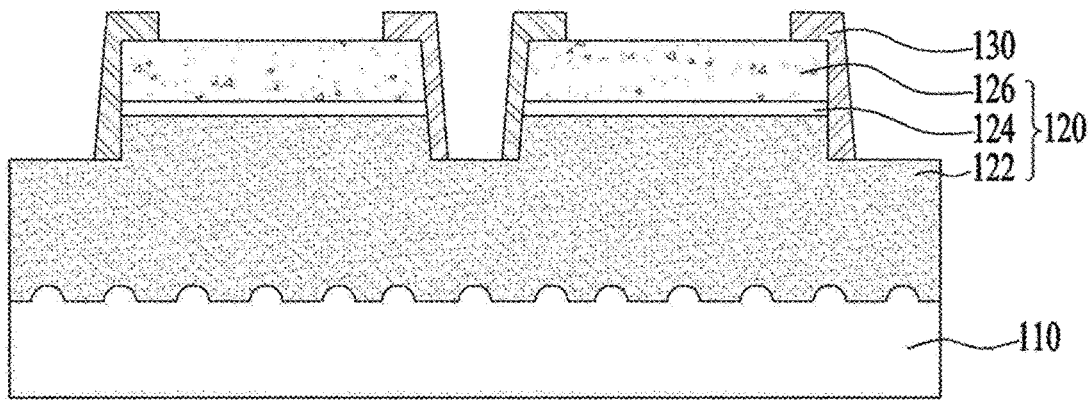

[FIG. 7D]
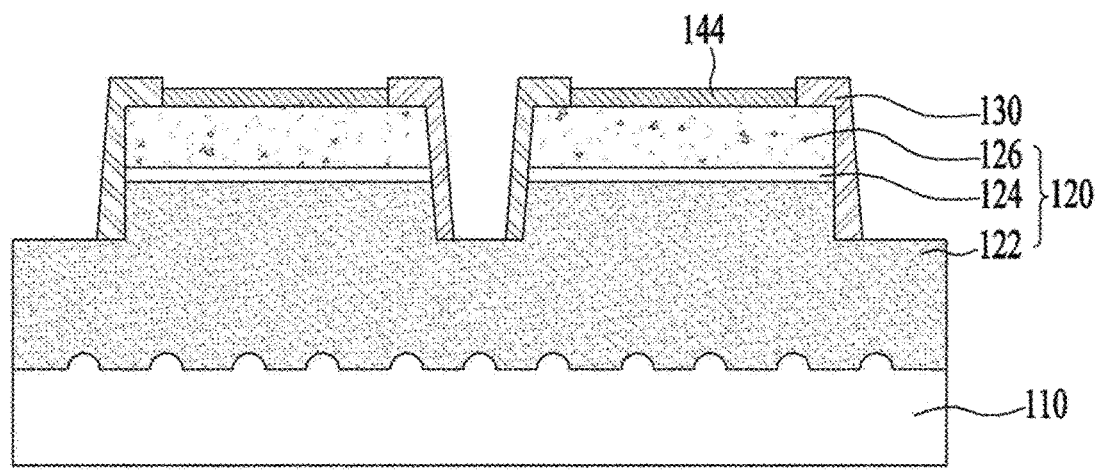
[FIG. 7E]
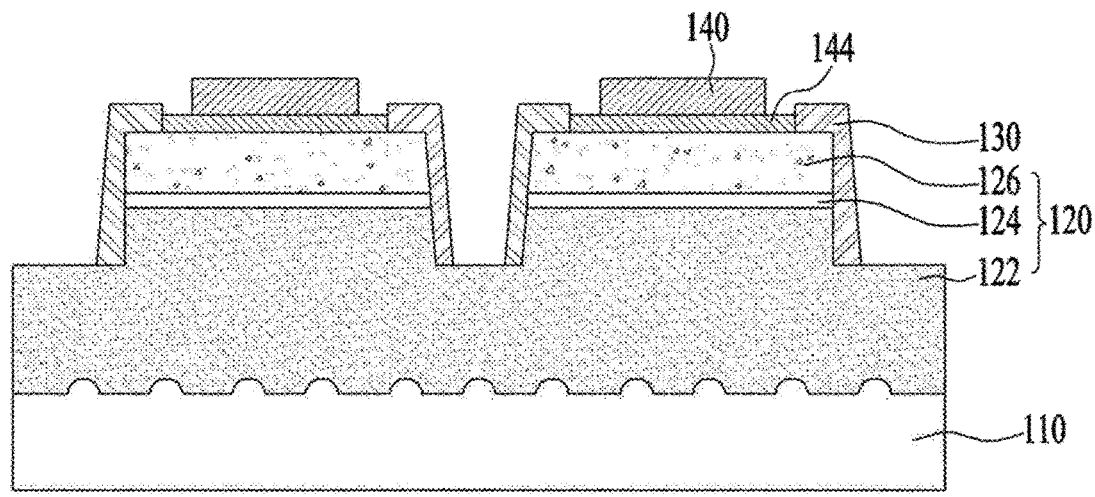

[FIG. 7F]
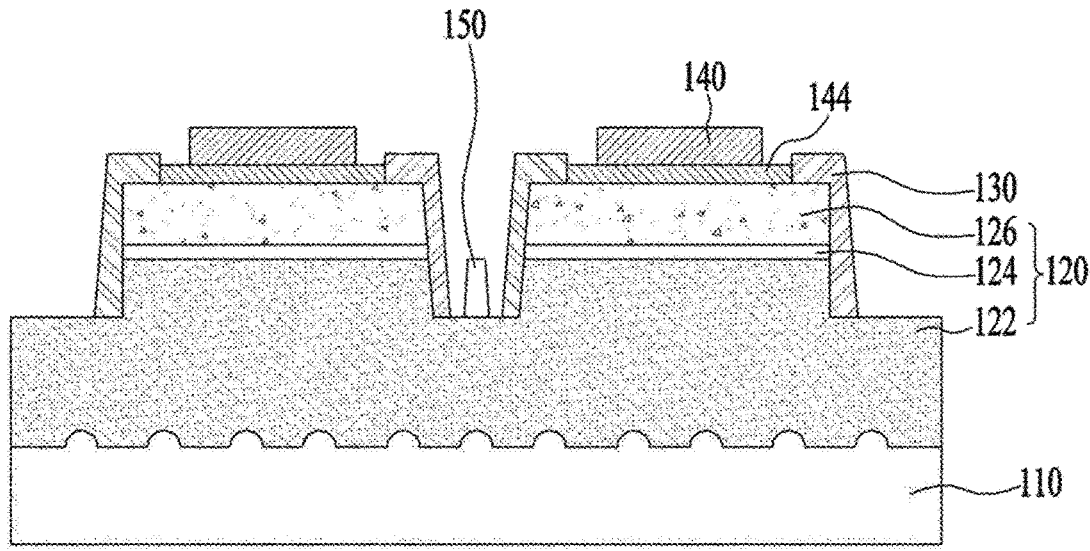
[FIG. 8]
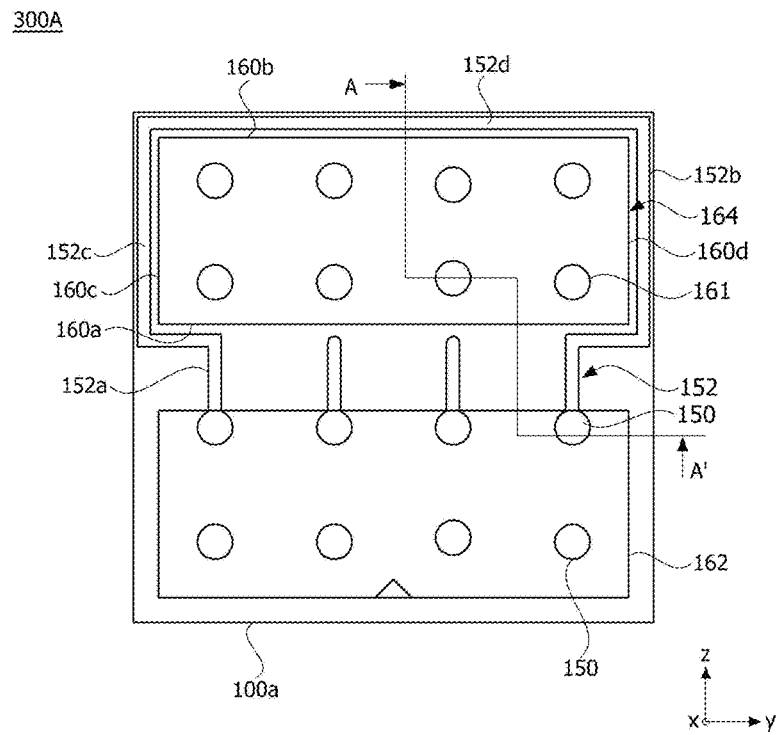

[FIG. 9]
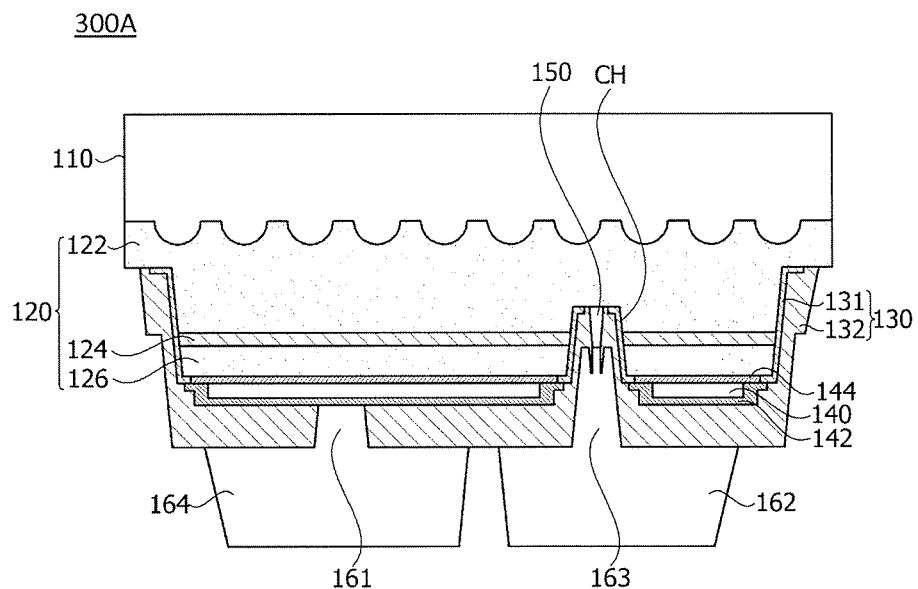
[FIG. 10]
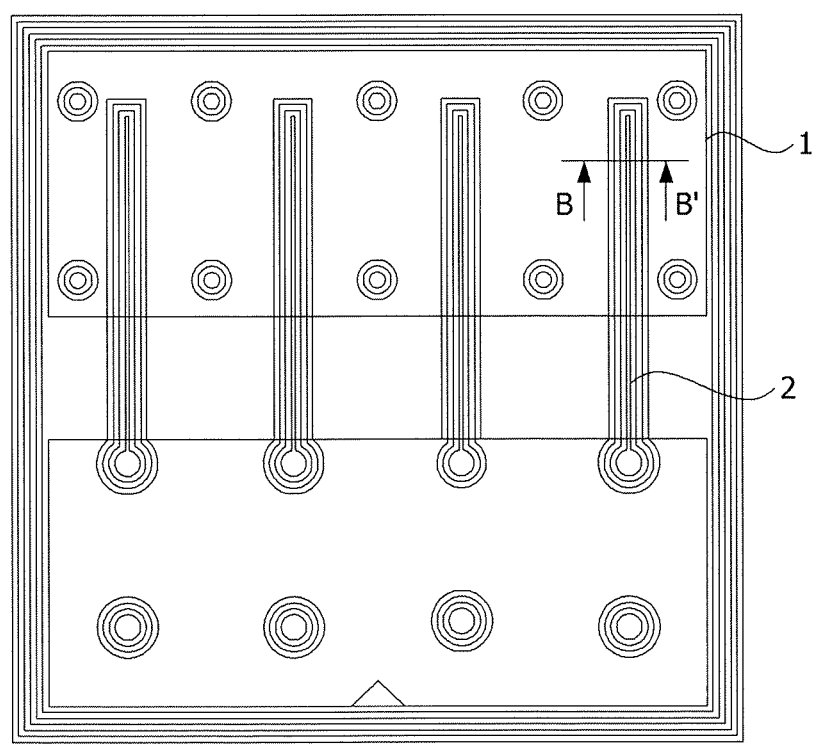

[FIG. 11]
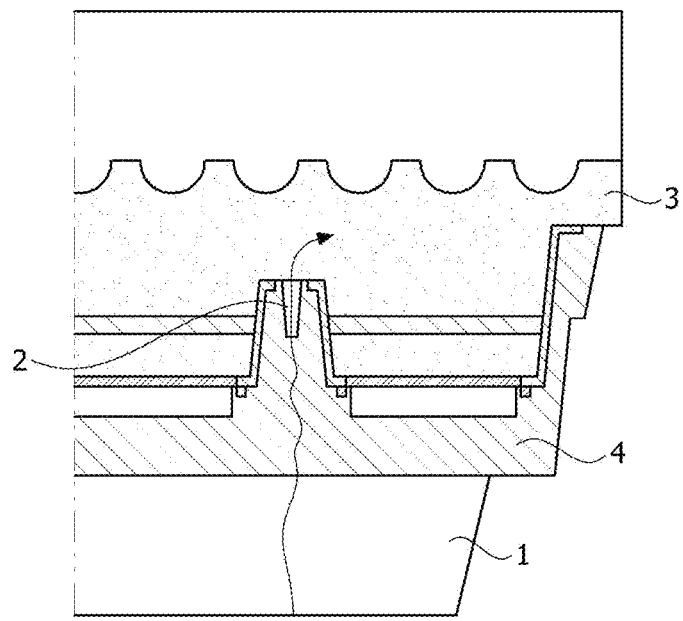
[FIG. 12]
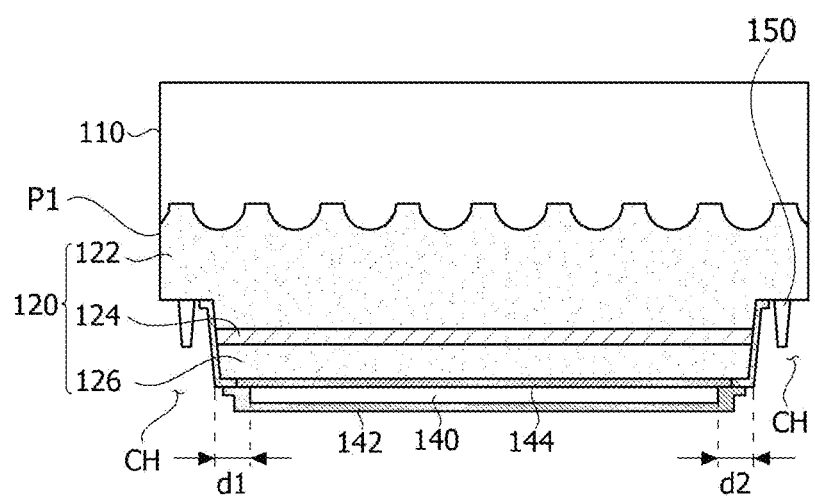

[FIG. 13]
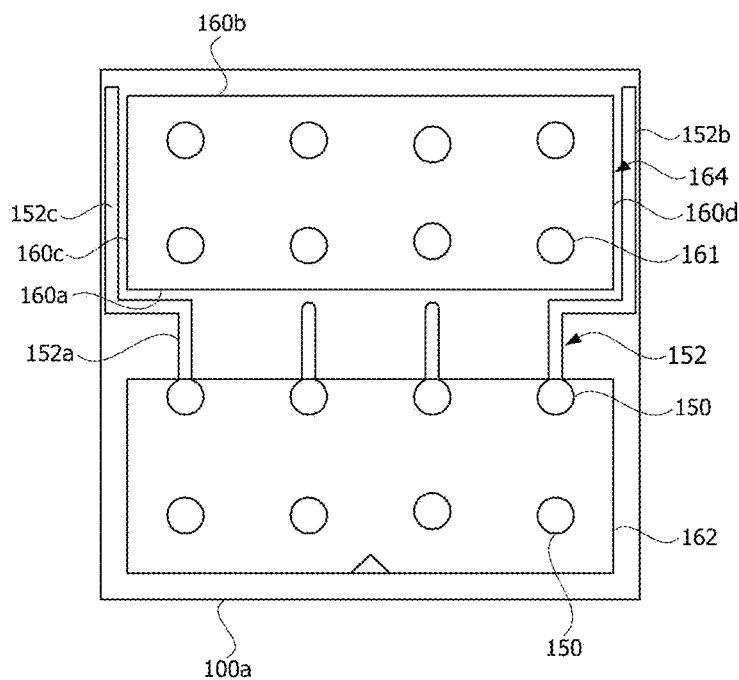

[FIG. 14]
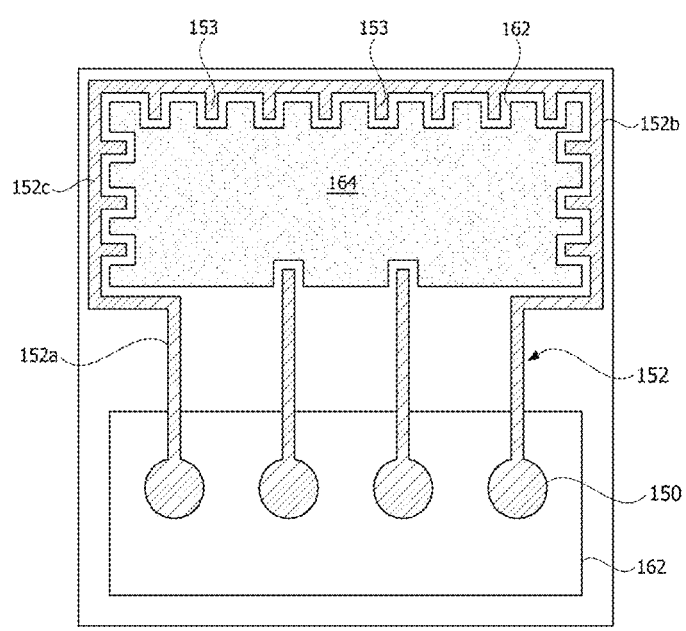

[FIG. 15]
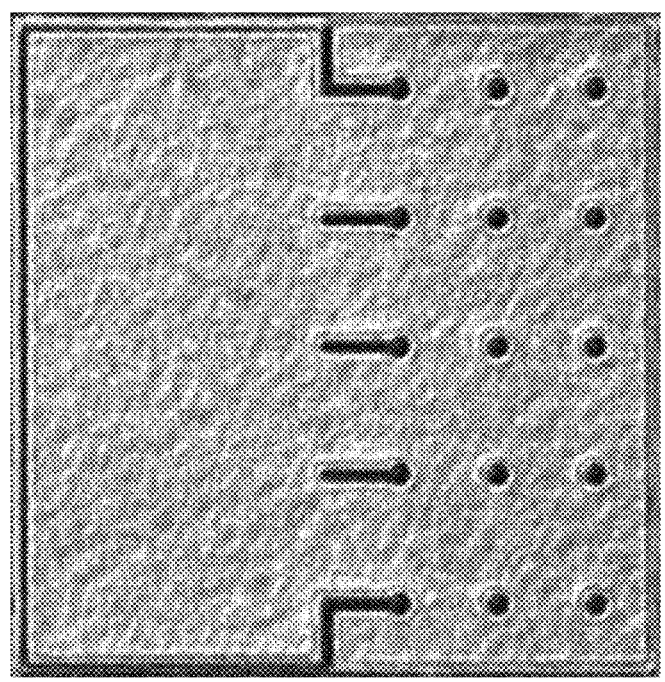

LIGHT-EMITTING ELEMENT AND LIGHT-EMITTING ELEMENT PACKAGE INCLUDING THE SAME

CROSS REFERENCE TO RELATED APPLICATIONS

This application is the National Phase of PCT International Application No. PCT/KR2017/001229, filed on Feb. 3, 2017, which claims priority under 35 U.S.C. 119(a) to Patent Application Nos. 10-2016-0015149, filed in the Republic of Korea on Feb. 5, 2016 and 10-2016-0017631, filed in the Republic of Korea on Feb. 16, 2016, all of which are hereby expressly incorporated by reference into the present application.

TECHNICAL FIELD

Exemplary embodiments relate to a light-emitting element and a light-emitting element package including the same.

BACKGROUND ART

A light emitting diode (LED) is a kind of semiconductor device that converts electricity into infrared light or light and receives or transmits signals, or is used as a light source by using properties of a compound semiconductor.

Group III-V nitride semiconductors have been in the spotlight as important materials of light-emitting elements such as an LED or a laser diode (LD) due to physical and chemical properties thereof.

Since the LED does not contain environmentally hazardous substances such as mercury (Hg), which is used in conventional lighting devices such as incandescent lamps and fluorescent lamps, the LED has high environment friendly properties, and since the LED has advantages of a prolonged lifetime, low power consumption properties, and the like, the LED has been replacing conventional light sources.

In the case of a conventional light-emitting element package having a flip-chip bonding structure, atoms of a reflective layer disposed on a lower portion of a p-GaN layer are migrated to reflect light emitted from an active layer, thus causing elements to be fatally affected, thereby requiring an improvement in reliability.

DISCLOSURE

Technical Problem

Exemplary embodiments provide a light-emitting element having improved reliability and a light-emitting element package including the same.

Technical Solution

One aspect of the present invention provides a light-emitting element including: a light-emitting structure including a first conductive type semiconductor layer, a second conductive type semiconductor layer, and an active layer disposed between the first conductive type semiconductor layer and the second conductive type semiconductor layer; a reflective layer disposed on the second conductive type semiconductor layer; a capping layer disposed on the reflective layer to surround the reflective layer; a first electrode electrically connected to the first conductive type semiconductor layer; a first bonding pad electrically connected to the first electrode; and a second bonding pad electrically connected to the second electrode, wherein the light-emitting structure includes a recess extending to a partial region of the first conductive type semiconductor layer through the second conductive type semiconductor layer and the active layer, the first electrode is disposed in the recess and electrically connected to the first conductive type semiconductor layer, the first electrode includes a region bent along a side surface of the second bonding pad, the reflective layer is disposed to be spaced apart from the recess, and the capping layer includes a transparent electrode.

The light-emitting element may further include a light-transmitting electrode layer disposed between the second conductive type semiconductor layer and the reflective layer.

The capping layer may include at least one of a transparent conductive oxide (TCO), a metal, and $SiO_2$.

The TCO may have a multi-layer structure.

The light-emitting element may further include an insulating layer disposed to surround the light-emitting structure and the capping layer.

A thermal expansion coefficient of the capping layer may have a value between a thermal expansion coefficient of the reflective layer and a thermal expansion coefficient of the insulating layer.

A separation distance between the reflective layer and the recess may be in a range of 3 μm to 30 μm.

The first electrode may include a first region extending toward the second bonding pad and a second region bent along a side surface of the second bonding pad.

The first electrode and the second bonding pad may be disposed not to overlap each other in a thickness direction of the light-emitting structure.

Advantageous Effects

In a light-emitting element and a light-emitting element package according to an exemplary embodiment, a capping layer is deposed to surround a reflective layer so that atoms of the reflective layer can be prevented from being migrated, the capping layer is disposed to reduce the interval of thermal expansion coefficients between the reflective layer and periphery layers thereof so that a peeling phenomenon can be prevented or minimized and processes can be simplified, the capping layer serves to spread a current so that electrical properties can be improved, and the capping layer is formed of a TCO instead of a metal material to transmit or reflect light so that light extraction efficiency can be improved.

DESCRIPTION OF DRAWINGS

FIG. 1 is a plan view of a light-emitting element according to one exemplary embodiment.

FIG. 2A is a cross-sectional view of a light-emitting element package according to one exemplary embodiment.

FIG. 2B is a cross-sectional view of a light-emitting element package according to another exemplary embodiment.

FIGS. 3A and 3B are enlarged cross-sectional views of exemplary embodiments of part A' shown in FIGS. 2A and 2B.

FIG. 4 is a cross-sectional view of another exemplary embodiment of a capping layer shown in FIGS. 2A and 2B.

FIG. 5 is a graph illustrating a change in surface resistance according to a flow rate of oxygen.

FIGS. 6A to 6E are process cross-sectional views for describing a method of manufacturing the light-emitting element shown in FIGS. 2A and 2B according to an exemplary embodiment.

FIGS. 7A to 7F are process cross-sectional views for describing a method of manufacturing a light-emitting element according to a comparative example.

FIG. 8 is a plan view of a light-emitting element according to still another exemplary embodiment of the present invention.

FIG. 9 is a cross-sectional view taken along line A-A of FIG. 8.

FIG. 10 is a plan view of a conventional light-emitting element.

FIG. 11 is a cross-sectional view taken along line B-B of FIG. 10.

FIG. 12 is a conceptual view illustrating a recess disposed at an edge of a light-emitting structure.

FIG. 13 is a first modified example of FIG. 8.

FIG. 14 is a second modified example of FIG. 8.

FIG. 15 shows measurement results of a light emission distribution of the light-emitting element.

MODES OF THE INVENTION

Hereinafter, exemplary embodiments will be described in detail to specifically describe the present invention with reference to the accompanying drawings to facilitating understanding about the present invention. However, exemplary embodiments of the present invention may be modified into various forms and, it should not be interpreted that the scope of the present invention is not limited to exemplary embodiments which will be described below. Exemplary embodiments of the present invention are provided to more completely explain the present invention to those with average skill in the art.

In the description of exemplary embodiments of the present invention, when an element is referred to as being "on or under" another element, the term "on or under" refers to either a direct connection between two elements or an indirect connection between two elements having one or more elements formed therebetween. In addition, when the term "on or under" is used, it may refer to a downward direction as well as an upward direction with respect to an element.

In addition, the relative terms such as "first" and "second," "on/upper/above" and "below/lower/under," and the like may be used to distinguish any one object or element from another object or element while not necessary requiring or indicating a physical or logical relation or order between the objects or elements.

In the drawings, a thickness or size of each layer is omitted or schematically shown for convenience and clarity of explanation. Further, a size of each component does not entirely reflect the actual size.

FIG. 1 is a plan view of a light-emitting element according to one exemplary embodiment, FIG. 2A is a cross-sectional view of a light-emitting element package according to one exemplary embodiment, FIG. 2B is a cross-sectional view of a light-emitting element package according to another exemplary embodiment, and FIGS. 3A and 3B are enlarged cross-sectional views of embodiments of part 'A' shown in FIGS. 2A and 2B.

A light-emitting element 100 shown in each of FIGS. 2A and 2B corresponds to a cross-sectional view of the light-emitting element 100 taken along line I-I' in FIG. 1.

Referring to FIGS. 1, 2A, and 2B, the light-emitting element 100 according to the exemplary embodiment may include a substrate 110, a light-emitting structure 120, an insulating layer 130, a reflective layer 140, a capping layer 142, a light-transmitting electrode layer 144 and a first electrode 150.

The light-emitting structure 120 may be disposed under the substrate 110. The substrate 110 may include a conductive material or a non-conductive material. For example, the substrate 110 may include at least one from among sapphire ($Al_2O_3$), GaN, SiC, ZnO, GaP, InP, $Ga_2O_3$, GaAs, and Si. Further, in order to help light emitted from an active layer 124 to escape from the light-emitting element 100, for example, the substrate 110 may be a patterned sapphire substrate (PSS) having patterns 112, but the exemplary embodiment is not limited thereto.

To improve differences in thermal expansion coefficients and a lattice mismatch between the substrate 110 and the light-emitting structure 120, a buffer layer (or transition layer, not shown) may be disposed between the substrate 110 and the light-emitting structure 120. The buffer layer may include at least one material selected from the group consisting of, for example, Al, In, N, and Ga, but is not limited thereto. Also, the buffer layer may have a single-layer or multi-layer structure.

The light-emitting structure 120 may include a first conductive type semiconductor layer 122, the active layer 124, and a second conductive type semiconductor layer 126, which are sequentially disposed under the substrate 110.

The first conductive type semiconductor layer 122 may be formed of a group III-V or II-VI compound semiconductor or the like doped with a first conductive type dopant. In the case in which the first conductive type semiconductor layer 122 is an N-type semiconductor layer, the first conductive type dopant may be an N-type dopant and may include Si, Ge, Sn, Se, or Te, but is not limited thereto.

For example, the first conductive type semiconductor layer 122 may include a semiconductor material having a composition formula of $Al_xIn_yGa_{(1-x-y)}N$ ($0<=x<=1$, $0<=y<=1$, and $0<=x+y<=1$). The first conductive type semiconductor layer 122 may include at least one from among GaN, InN, AlN, InGaN, AlGaN, InAlGaN, AlInN, AlGaAs, InGaAs, AlInGaAs, GaP, AlGaP, InGaP, AlInGaP, and InP.

The active layer 124 is disposed between the first conductive type semiconductor layer 122 and the second conductive type semiconductor layer 126, and is a layer in which electrons (or holes) injected through the first conductive type semiconductor layer 122 meet holes (or electrons) injected through the second conductive type semiconductor layer 126 and which emits light having energy determined by an inherent energy band of a material forming the active layer 124. The active layer 124 may be formed in at least one structure of a single well structure, a multi well structure, a single quantum well structure, a multi quantum well (MQW) structure, a quantum-wire structure, and a quantum dot structure.

A well layer/blocking layer of the active layer 124 may have a pair structure of any one or more from among InGaN/GaN, InGaN/InGaN, GaN/AlGaN, InAlGaN/GaN, GaAs(InGaAs)/AlGaAs, and GaP(InGaP)/AlGaP, but is not limited thereto. The well layer may be formed of a material having lower band gap energy than the blocking layer.

A conductive clad layer (not shown) may be formed above and/or under the active layer 124. The conductive clad layer may be formed of a semiconductor having higher band gap energy than the blocking layer of the active layer 124. For example, the conductive clad layer may include a GaN, AlGaN, InAlGaN, or super lattice structure. In addition, the conductive clad layer may be doped to be an N-type or P-type layer.

The second conductive type semiconductor layer 126 may be disposed under the active layer 124, formed of a compound semiconductor, and formed of the group III-V or II-VI compound semiconductor or the like. For example, the second conductive type semiconductor layer 126 may include a semiconductor material having a composition formula of $In_xAl_yGa_{1-x-y}N$ ($0<=x<=1$, $0<=y<=1$, and $0<=x+y<=1$). The second conductive type semiconductor layer 126 may be doped with a second conductive type dopant. In the case in which the second conductive type semiconductor layer 126 is a P-type semiconductor layer, the second conductive type dopant may include Mg, Zn, Ca, Sr, Ba, or the like as the P-type dopant.

The first conductive type semiconductor layer 122 may be formed as an N-type semiconductor layer, and the second conductive type semiconductor layer 126 may be formed as a P-type semiconductor layer. Alternatively, the first conductive type semiconductor layer 122 may also be formed as a P-type semiconductor layer, and the second conductive type semiconductor layer 126 may also be formed as an N-type semiconductor layer.

The light-emitting structure 120 may be formed in one structure from among an n-p junction structure, a p-n junction structure, an n-p-n junction structure, and a p-n-p junction structure.

Since the light-emitting element 100 shown in FIGS. 1, 2A, and 2B has a flip chip bonding structure, light emitted from the active layer 124 is emitted through the substrate 110 and the first conductive type semiconductor layer 122. To this end, the substrate 110 and the first conductive type semiconductor layer 122 may include a material having a light-transmitting property, and the second conductive type semiconductor layer 126 may include a material having the light-transmitting property or a non-light-transmitting property.

The first electrode 150 is formed on the first conductive type semiconductor layer 122 in a recess CH extending to a partial region of the first conductive type semiconductor layer 122 through the second conductive type semiconductor layer 126 and the active layer 124 to be electrically connected to the first conductive type semiconductor layer 122. Here, the recess CH will be described in more detail in FIG. 6D. For purpose of understanding, the first electrode 150 covered by first and second bonding pads 162 and 164 is shown by dotted lines and the reflective layer 140 covered by the second bonding pad 164 is shown by dotted lines in FIG. 1.

The first electrode 150 may include an ohmic contact material and perform an ohmic function. Accordingly, a separate ohmic layer (not shown) may be omitted. However, the present invention is not limited thereto, and the separate ohmic layer may be disposed between the first electrode 150 and the first conductive type semiconductor layer 122.

Further, the first electrode 150 may be formed of any material which may allow the light emitted from the active layer 124 to be reflected or transmitted without being absorbed, and may be grown in high quality in the first conductive type semiconductor layer 122. For example, the first electrode 150 may be formed of a metal and formed of Ag, Ni, Ti, Al, Rh, Pd, Ir, Ru, Mg, Zn, Pt, Au, Hf, Cr, and a selective composition thereof. For example, the first electrode 150 may be Cr/Ni/Au, but the exemplary embodiment is not limited thereto.

The insulating layer 130 may perform a function of electrically separating the first bonding pad 162, which will be described below, from the capping layer 142 and electrically separating the first bonding pad 162 from each of an inner surface of the light-emitting structure 120 and a side surface of the light-transmitting electrode layer 144, which are exposed at the recess CH. To this end, the insulating layer 130 may be disposed to surround the light-emitting structure 120 and the capping layer 142.

Specifically, the insulating layer 130 may be disposed to expose portions in which the second bonding pad 164 is in contact with the capping layer 142 and the first electrode 150, and surround the light-emitting structure 120 and the capping layer 142. That is, the insulating layer 130 may also be disposed between the first bonding pad 162 and the capping layer 142, and between each of the light-emitting structure 120 and light-transmitting electrode layer 144, which are exposed through a mesa etching process, and the first bonding pad 162. Also, the insulating layer 130 may be disposed between the second bonding pad 164 and the first electrode 150 to perform a function of electrically isolating the first electrode 150 and the second bonding pad 164 from each other.

Further, the insulating layer 130 may serve as a kind of current blocking layer (CBL). Also, the insulating layer 130 may perform a function of protecting the light-emitting structure 120 from foreign substances.

Also, the insulating layer 130 may be formed of a material having both electrical insulation properties and reflection properties to improve light extraction efficiency by reflecting light which leaks through a region on which the reflective layer 140 is not formed. For example, the insulating layer 130 may be formed of a distributed Bragg reflector (DBR), but the exemplary embodiment is not limited thereto.

For example, the insulating layer 130 may include at least one from among $SiO_2$, $TiO_2$, $ZrO_2$, $Si_3N_4$, $Al_2O_3$, and $MgF_2$.

The reflective layer 140 and the light-transmitting electrode layer 144 shown in FIGS. 2A and 2B may serve as a second electrode.

The light-transmitting electrode layer 144 may be disposed between the second conductive type semiconductor layer 126 and the reflective layer 140. That is, the light-transmitting electrode layer 144 may be disposed to overlap the second conductive type semiconductor layer 126 under the second conductive type semiconductor layer 126 in a thickness direction (for example, in an x-axis direction) of the light-emitting structure 120.

In the case of FIGS. 2A and 2B, the light-transmitting electrode layer 144 is shown to be a single layer, but the exemplary embodiment is not limited thereto. That is, the light-transmitting electrode layer 144 may have a multi-layer structure.

The light-transmitting electrode layer 144 may serve as an ohmic layer. A thickness of the light-transmitting electrode layer 144 may be in a range of 1 nm to 50 nm. When the thickness of the light-transmitting electrode layer 144 is 1 nm or more, a function of the ohmic layer may be improved, and thus electrical properties of the light-emitting element may be improved. When the thickness of the light-transmitting electrode layer 144 is 50 nm or less, a light path in the light-transmitting electrode layer 144 may be shortened, and thus a light absorption rate may be lowered. Accordingly, the light extraction efficiency of the light-emitting element may be improved, and thus optical properties of the light-emitting element may be improved.

The thickness of the light-transmitting electrode layer 144 may be 1 nm or more and 5 nm or less to improve the function of the ohmic layer and to lower the light absorption rate.

The light-transmitting electrode layer 144 may be a transparent conductive oxide (TCO). For example, the light-transmitting electrode layer 144 may include at least one from among zinc oxide (ZnO), indium tin oxide (ITO), indium zinc oxide (IZO), indium zinc tin oxide (IZTO), indium aluminum zinc oxide (IAZO), indium gallium zinc oxide (IGZO), indium gallium tin oxide(IGTO), aluminum zinc oxide(AZO), antimony tin oxide (ATO), gallium zinc oxide (GZO), IrOx, RuOx, RuOx/ITO, Ni/IrOx/IrOx/Au, and Ni/IrOx/IrOx/Au/ITO, but the material is not limited thereto. In some cases, the light-transmitting electrode layer 144 may be omitted.

The reflective layer 140 may be disposed under the second conductive type semiconductor layer 126 and may be electrically connected to the second conductive type semiconductor layer 126 through the light-transmitting electrode layer 144.

The reflective layer 140 may be formed of a metal layer containing aluminum (Al), gold (Au), silver (Ag), nickel (Ni), platinum (Pt), rhodium (Rh), titanium (Ti), chromium (Cr), or an alloy including Al, Ag, Pt, or Rh. For example, the reflective layer 140 may be Ag/Ni/Ti, but the exemplary embodiment is not limited thereto.

As described above, by forming the reflective layer 140 under the light-emitting structure 120, light, which is emitted from the active layer 124 and emitted downward toward first and second lead frames 182 and 184 without being emitted upward toward the substrate 110, is reflected and emitted from the reflective layer 140, thereby improving the light extraction efficiency.

Referring to FIG. 3A, the reflective layer 140 may be disposed to be spaced apart from an edge of the recess CH by a predetermined distance d. For example, when the predetermined distance d is secured, a problem in which a material forming the reflective layer 140 is migrated toward the recess CH of the light-emitting structure 120 to lower reliability of the light-emitting element may be resolved. For example, the predetermined distance d may be in a range of 3 μm to 30 μm, for example 19 μm, but the exemplary embodiment is not limited thereto. When the insulating layer 130 is formed of the DBR, light flux may not be greatly affected even when the area (i.e., width) of the reflective layer 140 is small.

Meanwhile, the material forming the reflective layer 140 may be migrated or diffused by a reduction reaction or heat. For example, when the material forming the reflective layer 140 is silver (Ag), the light-emitting element 100 may be electrically short-circuited by migration or diffusion of the silver (Ag). In order to prevent this, the capping layer 142 (142A and 142B) may be disposed under the reflective layer 140.

According to one exemplary embodiment, the capping layer 142A may include both a lower capping layer LP and a side capping layer SP as shown in FIG. 3A.

The lower capping layer LP may be disposed under the reflective layer 140 and the side capping layer SP may be disposed to extend from the lower capping layer LP to a side part of the reflective layer 140. The side capping layer SP which covers the side part of the reflective layer 140 may be positioned under the second conductive type semiconductor layer 126.

According to another exemplary embodiment, the capping layer 142B may include only the lower capping layer LP as shown in FIG. 3B. As described above, when the side capping layer SP is omitted and only the lower capping layer LP is disposed, the probability capable of preventing or reducing migration of the material forming the reflective layer 140 may be less than that of the capping layer 142A shown in FIG. 3A, but, as will be described below, the rapid change in differences in thermal expansion coefficients between the reflective layer 140 and layers disposed on a periphery of the reflective layer 140 may be eliminated.

The capping layers 142A and 142B may include at least one of transparent conductive oxide (TCO), metal, and $SiO_2$.

For example, the capping layers 142A and 142B may include a metal material such as W, Ti, Ni, or the like, or may be formed of an alloy thereof. For example, the capping layers 142A and 142B may be formed to have a TiW or Ni/Ti pair structure. Alternatively, the capping layers 142A and 142B may include TCO such as ZnO, ITO, IZO, IZTO, IAZO, IGZO, IGTO, AZO, ATO, GZO, IrOx, RuOx, or RuOx/ITO, but the exemplary embodiment is not limited thereto.

When the capping layers 142A and 142B include the metal material, the light emitted from the active layer 124 may be absorbed by the capping layers 142A and 142B, and an amount of light reflected by the capping layers 142A and 142B may be reduced. Particularly, the light emitted from the active layer 124 may be absorbed at an edge of the capping layers 142A and 142B, that is, at a point at which the lower capping layer LP meets the side capping layer SP.

When the capping layers 142A and 142B are formed of the transparent conductive oxide (TCO) instead of the metal material to prevent the light from being absorbed as described above, an amount of light absorbed by the capping layers 142A and 142B may be reduced and an amount of light reflected or transmitted by the capping layers 142A and 142B may be increased in comparison with the case in which the capping layers 142A and 142B are formed of the metal material, thereby improving the light extraction efficiency. For example, in the case of the TCO, light transmittance is 95% or more so that light transmitted through the capping layers 142A and 142B may be reflected by the insulating layer 130 which may be formed of the DBR, thereby improving the light extraction efficiency.

Further, when the capping layers 142A and 142B are formed of a material having electrical insulation such as $SiO_2$, the second bonding pad 164 may be in direct contact with the reflective layer 140 through the capping layers 142A and 142B instead of being in direct contact with the reflective layer 140 unlike the case shown in FIGS. 2A and 2B. In this case, a buffered oxide echant (BOE) etching process for etching the capping layers 142A and 142B may be added. On the other hand, when the capping layers 142A and 142B are formed of the metal material or an electrically conductive material such as the TCO, as shown in FIGS. 2A and 2B, the second bonding pad 164 may be in direct contact with the capping layers 142A and 142B and electrically connected to the reflective layer 140 so that the BOE etching process may not be required and the process may be simplified.

Further, when the capping layers 142A and 142B are formed of the TCO, a process time may be shortened in comparison with the case in which the capping layers 142A and 142B are formed of an insulation material such as $SiO_2$.

Further, a thickness t of the capping layers 142A and 142B disposed under the reflective layer 140 may be smaller when the capping layers 142A and 142B are formed of the TCO than when the capping layers 142A and 142B are formed of the metal material. For example, the thickness of the capping layers 142A and 142B formed of the metal material may be at least ten times greater than that of the capping layers 142A and 142B formed of the TCO.

When the capping layers 142A and 142B are formed of the TCO, the great thickness t of the capping layers 142A and 142B may affect light absorption, and accordingly, the small thickness t may be achieved. For example, the thickness t of the capping layers 142A and 142B formed of the TCO may be in a range of 1 nm and 50 nm.

When the thickness t of the capping layers 142A and 142B is greater than 1 nm, the function of preventing migration of the reflective layer 140 may be secured, and a problem, in which a material forming the first bonding pad 162 or second bonding pad 164, which will be described below, diffuses into the reflective layer 140 and thus a reflective function of the reflective layer 140 is degraded, may be resolved. Also, when the thickness t of the capping layers 142A and 142B is 50 nm or less, the amount of light absorbed by the capping layers is reduced, thereby improving the light extraction efficiency of the light-emitting element.

Further, as illustrated in FIG. 3A, in the capping layer 142A, the side capping layer SP may be deposited to have a thickness smaller than that of the lower capping layer LP due to limitations of step-coverage characteristics.

FIG. 4 is a cross-sectional view of another exemplary embodiment of the capping layer 142 shown in FIGS. 2A and 2B.

As shown in FIGS. 1, 2A, 2B, 3A, and 3B, the capping layer 142 (142A and 142B) may have a single-layer structure, but the exemplary embodiment is not limited thereto. That is, according to another exemplary embodiment, the capping layer 142 (142A and 142B) may have a multi-layer structure. In particular, when the capping layers 142A and 142B are formed of the TCO, the capping layers 142A and 142B may have a structure in which a plurality of ITO layers are stacked. For example, as shown in FIG. 4, the capping layer 142 (142A and 142B) may include a plurality of first, second and third ITO layers 142-1, 142-2, and 142-3.

FIG. 5 is a graph illustrating a change in surface resistance according to a flow rate of oxygen, wherein a horizontal axis denotes the flow rate of the oxygen, and a vertical axis denotes the surface resistance.

FIG. 5 illustrates surface resistance of the ITO layer with respect to a change in temperature of the substrate 110 when the capping layer 142 (142A and 142B) is disposed on the substrate 110 instead of under the reflective layer 140. Here, RT may represent room temperature (RT). However, the graph shown in FIG. 5 may be applied even when the capping layer 142 (142A and 142B) is disposed on the reflective layer 140 instead of on the substrate 110.

The capping layer 142 (142A and 142B) may be formed by depositing the ITO on the reflective layer 140 while varying the flow rate of the oxygen using a sputtering method. Referring to FIG. 5, it may be seen that oxygen vacancies are generated as an amount of the oxygen increases, and thus the surface resistance of each of the ITO layers 142-1, 142-2, and 142-3 increases. As described above, the capping layer 142 may perform a function of spreading a current by stacking the ITO layers 142-1 to 142-3 into multiple layers to form the capping layer 142 (142A and 142B) using a property in which the surface resistance increases when the amount of the oxygen exceeds a certain level.

For example, a flow rate of the oxygen when forming the first ITO layer 142-1 may be in a range of 0 to 2 sccm, a flow rate of the oxygen when forming the second ITO layer 142-2 may be 4 sccm, and a flow rate of the oxygen when forming the third ITO layer 142-3 may be in a range of 0 to 2 sccm, but the exemplary embodiment is not limited to such a specific flow rate of the oxygen.

As shown in FIG. 3A, when the lower and side capping layers LP and SP are disposed to surround the reflective layer 140, a phenomenon in which the material forming the reflective layer 140 such as silver (Ag) is migrated may be improved.

Alternatively, as shown in FIG. 3A or 3B, when the lower capping layer LP is disposed under the reflective layer 140, the differences in thermal expansion coefficients between the reflective layer 140 and periphery layers 130 and 164 of the reflective layer 140 may be reduced, so that a peeling phenomenon may be prevented or minimized.

For example, a first thermal expansion coefficient of the capping layer 142 (142A and 142B) may be a value between a second thermal expansion coefficient of the reflective layer 140 and a third thermal expansion coefficient of the insulating layer 130.

Table 1 below shows thermal expansion coefficients of various materials.

TABLE 1

| Material | TCE ($10^{-6}/°$ C.) |
|---|---|
| $TiO_2$ | 0.8 |
| $SiO_2$ | 0.55 |
| ITO | 8.5 |
| Ni | 13 |
| Ag | 19.5 |
| ITO | 8.5 |
| GaN | 3.17 |

When the light-emitting element 100 does not include the capping layer 142 (142A and 142B), the insulating layer 130 may be in direct contact with the reflective layer 140. In this case, when the reflective layer 140 is formed of silver (Ag) and the insulating layer 130 is formed of $SiO_2$, a difference in thermal expansion coefficients between the insulating layer 130 and the reflective layer 140 is '18.95' as can be seen from values in Table 1.

On the other hand, as shown in the exemplary embodiment, when the light-emitting element 100 includes the capping layer 142 (142A and 142B), that is, the capping layer 142 (142A and 142B) is disposed between the reflective layer 140 and the insulating layer 130, a difference in thermal expansion coefficients between the reflective layer 140 and the insulating layer 130 may be reduced. In this case, referring to Table 1, when the reflective layer 140 is formed of silver (Ag), the insulating layer 130 is formed of $SiO_2$, and the capping layer 142 is formed of ITO, a difference in thermal expansion coefficients between the reflective layer 140 and the capping layer 142 is '11', and a difference in thermal expansion coefficients between the capping layer 142 and the insulating layer 130 is '7.95'. As described above, the difference in thermal expansion coefficients is reduced from '18.95' to '11' and '7.95', so that the peeling phenomenon between the reflective layer 140 and the insulating layer 130 caused by heat may not occur or the possibility of occurrence may be lowered.

Referring to Table 1, when the capping layer 142 (142A and 142B) is formed of the metal material, the difference in thermal expansion coefficients between the capping layer 142 and the reflective layer 140 is smaller than that in a case in which the capping layer 142 (142A and 142B) is formed of the TCO, but the difference in thermal expansion coefficients between the capping layer 142 (142A and 142B) and the insulating layer 130 is greater than that in a case in which the capping layer 142 is formed of the ITO. Accordingly, the possibility of occurrence of the peeling phenomenon may be relatively greater when the capping layer 142 (142A and 142B) is formed of the metal material than formed of the TCO.

Thus, the capping layer 142 may be formed of a material (e.g., TCO) having a thermal expansion coefficient close to an intermediate value of the thermal expansion coefficient of the reflective layer 140 and the thermal expansion coefficient of the insulating layer 130.

Further, a light-emitting element package 200 shown in FIG. 2A may have a chip scale package (CSP) shape and include the light-emitting element 100, the first and second bonding pads 162 and 164, first and second solder parts 172 and 174, the first and second lead frames 182 and 184, and an insulation part 186. In the case of the light-emitting element package 200 having the CSP shape, the light-emitting element 100 is mounted on the first and second lead frames 182 and 184.

However, according to another exemplary embodiment, the light-emitting element package 200 shown in FIG. 2B may further include a package body 188 and a molding member 190 as well as the light-emitting element 100, the first and second bonding pads 162 and 164, the first and second solder parts 172 and 174, the first and second lead frames 182 and 184, and the insulation part 186. As described above, the light-emitting element package 200 shown in FIG. 2B may further include the package body 188 and the molding member 190, unlike the light-emitting element package 200 shown in FIG. 2A. Except this, the light-emitting element package 200 shown in FIG. 2A and the light-emitting element package 200 shown in FIG. 2B are identical to each other.

A partial region of the first bonding pad 162 may pass through the second conductive type semiconductor layer 126 and the active layer 124 to be buried in the recess CH which exposes a partial region of the first conductive type semiconductor layer 122 and electrically connected to the first conductive type semiconductor layer 122 through the first electrode 150.

The second bonding pad 164 may be in direct contact with the capping layer 142 through the insulating layer 130 disposed under the second conductive type semiconductor layer 126. As described above, the second bonding pad 164 may be electrically connected to the second conductive type semiconductor layer 126 through the capping layer 142, the reflective layer 140, and the light-transmitting electrode layer 144.

The first bonding pad 162 and the second bonding pad 164 may be disposed to be spaced apart from each other in a direction crossing (for example, orthogonal to) a thickness direction of the light-emitting structure 120.

Each of the first and second bonding pads 162 and 164 may include a metal material having electrical conductivity and may include the same material as a material forming the first electrode 150 or a different material. Each of the first and second bonding pads 162 and 164 may include at least one of Ti, Ni, and Au, but the exemplary embodiment is not limited thereto.

The first solder part 172 is disposed between the first bonding pad 162 and the first lead frame 182 and performs a function of electrically connecting the first bonding pad 162 to the first lead frame 182. The second solder part 174 is disposed between the second bonding pad 164 and the second lead frame 184 and performs a function of electrically connecting the second bonding pad 164 to the second lead frame 184.

Each of the first and second solder parts 172 and 174 may be a solder paste or a solder ball, but the exemplary embodiment is not limited thereto. For example, each of the first and second solder parts 172 and 174 may include at least one of Ti, Ag, and Cu. For example, each of the first and second solder parts 172 and 174 may be a SAC series (96.5% Ti, 3% Ag, and 0.5% Cu), but the exemplary embodiment is not limited thereto.

The above-described first solder part 172 electrically connects the first conductive type semiconductor layer 122 to the first lead frame 182 through the first bonding pad 162 and the above-described second solder part 174 electrically connects the second conductive type semiconductor layer 126 to the second lead frame 184 through the second bonding pad 164, thereby eliminating a need for wires. However, according to another exemplary embodiment, the first and second conductive type semiconductor layers 122 and 126 may be respectively connected to the first and second lead frames 182 and 184 using the wires.

The first lead frame 182 may be electrically connected to the first bonding pad 162 through the first solder part 172 and the second lead frame 184 may be electrically connected to the second bonding pad 164 through the second solder part 174. The first and second lead frames 182 and 184 may be electrically separated from each other by the insulation part 186. Each of the first and second lead frames 182 and 184 may be formed of a conductive material such as a metal, but the exemplary embodiment is not limited to the kind of the material of each of the first and second lead frames 182 and 184.

Referring again to FIGS. 2A and 2B, the light-emitting element package 200 corresponds to a solder bonding method including the first and second solder parts 172 and 174. However, the exemplary embodiment is not limited thereto. That is, another exemplary embodiment is a eutectic bonding method, and the first solder part 172 and the second solder part 174 may be omitted in the light-emitting element package 200. In this case, the first bonding pad 162 performs a function of the first solder part 172, and the second bonding pad 164 performs a function of the second solder part 174. That is, when the first solder part 172 and the second solder part 174 are omitted, the first bonding pad 162 shown in FIGS. 2A and 2B may be directly connected to the first lead frame 182, and the second bonding pad 164 may be directly connected to the second lead frame 184. In this case, each of the first and second bonding pads 162 and 164 may include at least one of Ti, Ni, Au, and Sn. For example, each of the first and second bonding pads 162 and 164 may be Ti/Ni/Au/Sn/Au, but the exemplary embodiment is not limited thereto.

The insulation part 186 is disposed between the first and second lead frames 182 and 184 to electrically isolate the first and second lead frames 182 and 184 from each other. To this end, the insulation part 186 may include at least one from among $SiO_2$, $TiO_2$, $ZrO_2$, $Si_3N_4$, $Al_2O_3$, and $MgF_2$, but the exemplary embodiment is not limited thereto.

Also, the package body 188 may form a cavity C with the first and second lead frames 182 and 184, but the exemplary embodiment is not limited thereto. According to another exemplary embodiment, the cavity C may be formed by only the package body 188. Alternatively, a barrier wall (not shown) may also be disposed on the package body 188 having a flat upper surface, and the cavity may also be defined by the barrier wall and the upper surface of the package body 188.

The light-emitting element 100 may be disposed in the cavity C as shown in FIG. 2B.

The package body 188 may be formed by including silicon, synthetic resin, or metal. When the package body 188 includes a conductive material such as a metal material, the first and second lead frames 182 and 184 may also be portions of the package body 188. Even in this case, the package body 188 forming the first and second lead frames 182 and 184 may be electrically separated from each other by the insulation part 186.

Further, the molding member 190 may be disposed to surround and protect the light-emitting element 100 disposed in the cavity C. Since the molding member 190 may be formed of, for example, silicone (Si) and may include a phosphor, the molding member 190 may change a wavelength of light emitted by the light-emitting element 100. The phosphor may include a fluorescent material which is one wavelength changing material among an yttrium aluminum garnet (YAG)-based phosphor, a terbium aluminum garnet (TAG)-based phosphor, a silicate-based phosphor, a sulfide-based phosphor, and a nitride-based phosphor capable of converting light generated by the light-emitting element 100 into white light, but the exemplary embodiment is not limited to the kind of the phosphors.

The YAG-based and TAG-based fluorescent materials may be selected from among (Y, Tb, Lu, Sc, La, Gd, Sm)3(Al, Ga, In, Si, Fe)5(O,S)12:Ce, and the silicate-based fluorescent material may be selected from among (Sr, Ba, Ca, Mg)2SiO4:(Eu, F, Cl).

In addition, the sulfide-based fluorescent material may be selected from among (Ca, Sr)S:Eu, (Sr,Ca, Ba)(Al, Ga)2S4: Eu, the nitride-based phosphor may be (Sr, Ca, Si, Al, O)N:Eu (for example, CaAlSiN4:Eu β-SiAlON:Eu) and (Cax, My)(Si, Al)12(O, N)16 which is a Ca-α SiAlON:Eu-based phosphor, (0.05<x+y<0.3, 0.02<x<0.27 and 0.03<y<0.3), wherein M is at least one material among Eu, Tb, Yb, and Er, and phosphor components may be selected to be used in the M.

The nitride-based phosphor including N (for example, CaAlSiN3:Eu) may be used as a red phosphor. The nitride-based red phosphor has a higher reliability in an external environment such as heat and humidity and a lower discolor possibility than the sulfide-based phosphor.

FIGS. 6A to 6E are process cross-sectional views for describing a method of manufacturing the light-emitting element 100 shown in FIGS. 2A and 2B, according to an exemplary embodiment. However, the light-emitting element shown in FIGS. 2A and 2B may also be manufactured by another manufacturing method.

Referring to FIG. 6A, a light-emitting structure 120 may be formed on a substrate 110. The substrate 110 may include a conductive material or a non-conductive material. For example, the substrate 110 may include at least one from among sapphire ($Al_2O_3$), GaN, SiC, ZnO, GaP, InP, $Ga_2O_3$, GaAs, and Si.

The light-emitting structure 120 may be formed by sequentially stacking a first conductive type semiconductor layer 122, an active layer 124, and a second conductive type semiconductor layer 126 on the substrate 110.

The first conductive type semiconductor layer 122 may be formed using a group III-V or II-VI compound semiconductor or the like doped with a first conductive type dopant. In a case in which the first conductive type semiconductor layer 122 is an N-type semiconductor layer, the first conductive type dopant may be an N-type dopant and may include Si, Ge, Sn, Se, or Te, but is not limited thereto.

For example, the first conductive type semiconductor layer 122 may be formed using a semiconductor material having a composition formula of $Al_xIn_yGa_{(1-x-y)}N$ ($0<=x<=1$, $0<=y<=1$, and $0<=x+y<=1$). The first conductive type semiconductor layer 122 may be formed using at least one from among GaN, InN, AlN, InGaN, AlGaN, InAlGaN, AlInN, AlGaAs, InGaAs, AlInGaAs, GaP, AlGaP, InGaP, AlInGaP, and InP.

The active layer 124 may be formed in at least one structure of a single well structure, a multi well structure, a single quantum well structure, a multi quantum well (MQW) structure, a quantum-wire structure, and a quantum dot structure.

A well layer/blocking layer of the active layer 124 may have a pair structure of any one or more from among InGaN/GaN, InGaN/InGaN, GaN/AlGaN, InAlGaN/GaN, GaAs(InGaAs)/AlGaAs, and GaP(InGaP)/AlGaP, but is not limited thereto. The well layer may be formed of a material having lower band gap energy than the blocking layer.

A conductive clad layer (not shown) may be formed above and/or under the active layer 124. The conductive clad layer may be formed of a semiconductor having higher band gap energy than the blocking layer of the active layer 124. For example, the conductive clad layer may include a GaN, AlGaN, InAlGaN, or super lattice structure. In addition, the conductive clad layer may be doped to be an N-type or P-type layer.

The second conductive type semiconductor layer 126 may be formed of a compound semiconductor and may be formed using the group III-V or II-VI compound semiconductor or the like. For example, the second conductive type semiconductor layer 126 may include a semiconductor material having a composition formula of $In_xAl_yGa_{1-x-y}N$ ($0<=x<=1$, $0<=y<=1$, and $0<=x+y<=1$). The second conductive type semiconductor layer 126 may be doped with a second conductive type dopant. In a case in which the second conductive type semiconductor layer 126 is a P-type semiconductor layer, the second conductive type dopant may include Mg, Zn, Ca, Sr, Ba, or the like as the P-type dopant.

A light-transmitting electrode layer 144 may be formed on the light-emitting structure 120. In the case of FIG. 6A, the light-transmitting electrode layer 144 is shown to be a single layer, but the exemplary embodiment is not limited thereto. That is, the light-transmitting electrode layer 144 may have a multi-layer structure. For example, the light-transmitting electrode layer 144 may have a thickness of 1 nm to 30 nm as described above. As described above, effects on the thickness range may improve the electrical properties of the light-emitting element by improving the ohmic function and may improve the optical properties of the light-emitting element by lowering the light absorption rate. The light-transmitting electrode layer 144 may be formed of transparent conductive oxide (TCO). In some cases, the light-transmitting electrode layer 144 may be omitted. When the light-transmitting electrode layer 144 is formed of ITO, heat treatment may be performed after forming the ITO.

Subsequently, referring to FIG. 6B, a reflective layer 140 may be formed on the light-transmitting electrode layer 144.

For example, a reflective material layer for forming the reflective layer 140 may be formed on an entire surface of the light-transmitting electrode layer 144, and a 1-1 mask (not shown), which has a pattern covering a region on which the reflective layer 140 is to be formed and exposing the remaining part, may be formed on the reflective material layer. Thereafter, the reflective layer 140 may be formed in a shape as shown in FIG. 6B by etching the reflective material layer by a photolithography process using the 1-1 mask and removing the 1-1 mask. Here, the reflective material layer may be formed of a material selected from the group consisting of aluminum (Al), gold (Au), silver (Ag), nickel (Ni), platinum (Pt), rhodium (Rh), titanium (Ti), chromium (Cr), and an alloy including Al, Ag, Pt, or Rh. For example, the reflective material layer may be formed in a form of Ag/Ni/Ti, but the exemplary embodiment is not limited thereto.

Further, the reflective layer 140 may be formed to be spaced apart from a recess region CHA on which the recess CH is to be disposed, by a predetermined distance d. For example, the predetermined distance d may be in a range of 3 µm to 30 µm, for example, 19 µm. When the predetermined distance d is 3 µm or more, a problem in which a material forming the reflective layer 140 is migrated toward the recess CH to lower reliability of the light-emitting element may be resolved. Also, it may be advantageous in ensuring a yield due to an error between a central region and an edge region of a wafer, which may occur in the wafer during the process.

The error may be greater when the wafer is concavely or convexly bent, and as the size of the wafer increases, a ratio of the thickness between the light-emitting structure and the wafer may vary accordingly.

When the predetermined distance d is 3 µm or more, a process margin may be secured and it may be advantageous for improving the yield. Also, when the predetermined distance d is 30 µm or less, a region for reflecting the light emitted from the active layer 124 may be secured. Therefore, when the predetermined distance d is 3 µm or more and 30 µm or less, the reliability and yield of the light-emitting element may be improved and the light extraction efficiency may be improved. For example, the predetermined distance d may be in a range of 3 µm to 19 µm, and in this range, the reliability and yield of the light-emitting element may be improved and the light extraction efficiency may be further improved.

Thereafter, as shown in FIG. 6C, a capping layer 142A may be formed on the reflective layer 140 and the light-transmitting electrode layer 144. The capping layers 142A may be disposed using at least one of transparent conductive oxide (TCO), metal, and $SiO_2$.

For example, each of the light-transmitting electrode layer 144 and the capping layer 142A may be formed using ITO. Here, as shown in FIG. 6A, in order to form the light-transmitting electrode layer 144, the ITO is formed on the second conductive type semiconductor layer 126 and the heat treatment, which is necessary to generate ohmic properties with the second conductive type semiconductor layer 126, is performed.

Subsequently, as shown in FIG. 6D, the recess CH may be formed so that a partial region of the first conductive type semiconductor layer 122 is exposed through the second conductive type semiconductor layer 126 and the active layer 124.

For example, a 1-2 mask (not shown) having a pattern that exposes the recess region CHA and covers other parts may be formed on the capping layer 142A shown in FIG. 6C. Thereafter, the capping layer 142A, the light-transmitting electrode layer 144, the second conductive type semiconductor layer 126, the active layer 124, and the first conductive type semiconductor layer 122 are mesa-etched by the photolithography process using the 1-2 mask, and the 1-2 mask is removed to form the recess CH in the shape as shown in FIG. 6D.

Thereafter, referring to FIG. 6E, a first electrode 150 may be formed on the first conductive type semiconductor layer 122 exposed in the recess CH.

For example, a material layer for forming the electrode is disposed on the recess CH and the capping layer 142A shown in FIG. 6D, a 1-3 mask (not shown) having a pattern, which covers a region on which the first electrode 150 is to be disposed and exposes the remaining region, is formed on the material layer for forming the electrode, the material layer for forming the electrode is etched by a conventional photolithography process using the 1-3 mask, and the 1-3 mask is removed to form the first electrode 150 as shown in FIG. 6E.

Here, the material layer for forming the electrode may include a metal such as Ag, Ni, Ti, Al, Rh, Pd, Ir, Ru, Mg, Zn, Pt, Au, Hf, Cr, and a selective composition thereof. For example, the material layer for forming the electrode may be Cr/Ni/Au, but the exemplary embodiment is not limited thereto.

Thereafter, an insulation material layer is disposed on the capping layer 142A, the recess CH and the first electrode 150 shown in FIG. 6E, a 1-4 mask (not shown) having a pattern, which exposes a region in which the second bonding pad 164 is in contact with the capping layer 142A, and the first electrode 150, and covers the remaining region, is disposed on the insulation material layer, the insulation material layer is etched by the conventional photolithography process using the 1-4 mask, and the 1-4 mask is removed to form the insulating layer 130 as shown in FIGS. 2A and 2B. Here, the insulation material layer may include at least one of $SiO_2$, $TiO_2$, $ZrO_2$, $Si_3N_4$, $Al_2O_3$, or $MgF_2$.

Hereinafter, a method of manufacturing the light-emitting element according to a comparative example will be described with reference to attached FIGS. 7A to 7F. Here, in order to avoid redundant descriptions, the same reference numerals are used for the same members as those illustrated in the process cross-sectional views shown in FIGS. 6A to 6E.

FIGS. 7A to 7F are process cross-sectional views for describing a method of manufacturing a light-emitting element according to comparative examples.

Referring to FIG. 7A, a light-emitting structure 120 may be disposed on a substrate 110. This is the same as that shown in FIG. 6A, and thus redundant explanations are omitted.

Subsequently, referring to FIG. 7B, a second conductive type semiconductor layer 126, an active layer 124, and a first conductive type semiconductor layer 122 are mesa-etched to form a recess CH.

For example, a 2-1 mask (not shown) which exposes the recess region CHA and covers the remaining region is formed on the second conductive type semiconductor layer 126, the light-emitting structure 120 is mesa-etched by the conventional photolithography process using the 2-1 mask, and the 2-1 mask is removed to form the recess CH as shown in FIG. 7B.

Thereafter, referring to FIG. 7C, an insulation material layer is applied on the light-emitting structure 120 including the recess CH, a 2-2 mask (not shown) is disposed on the insulation material layer, the insulation material layer is etched by the conventional photolithography process using the 2-2 mask, and the 2-2 mask is removed to form an insulating layer 130.

Thereafter, referring to FIG. 7D, a light-transmitting electrode layer 144 may be disposed on the second conductive type semiconductor layer 126 exposed by the insulating layer 130.

For example, a material layer for forming the light-transmitting electrode layer 144 is applied on an entire surface of the light-emitting structure 120 and insulating layer 130 shown in FIG. 7C, a 2-3 mask having a pattern, which exposes a region other than a region on which the light-transmitting electrode layer 144 is to be formed, is formed on the material layer for forming the light-transmitting electrode layer 144, the material layer for forming the light-transmitting electrode layer 144 is etched by the conventional photolithography process using the 2-3 mask, and the 2-3 mask is removed to form the light-transmitting electrode layer 144 as shown in FIG. 7D.

Subsequently, referring to FIG. 7E, a reflective layer 140 may be formed on the light-transmitting electrode layer 144.

For example, a material layer for forming the reflective layer is applied on the light-transmitting electrode layer 144, the insulating layer 130, and the exposed first conductive type semiconductor layer 122, which are shown in FIG. 7D, a 2-4 mask (not shown) is formed on the material layer for forming the reflective layer, the conventional photolithography process is performed using the 2-4 mask, and the 2-4 mask is removed to form the reflective layer 140 as shown in FIG. 7E.

Thereafter, referring to FIG. 7F, a first electrode 150 may be disposed on the first conductive type semiconductor layer 122 exposed in the recess CH.

For example, a material layer for forming the first electrode 150 is applied on the insulating layer 130, the light-transmitting electrode layer 144, the reflective layer 140, and the recess CH, which are shown in FIG. 7E, a 2-5 mask (not shown) is formed on the material layer for forming the first electrode 150, the material layer for forming the first electrode 150 is etched by the conventional photolithography process using the 2-5 mask, and the mask 2-5 is removed to form the first electrode 150 as shown in FIG. 7F.

As described above, in a case of the manufacturing method according to the comparative example, as shown in FIGS. 7A to 7F, five masks 2-1 to 2-5 are used until the first electrode 150 is formed. On the other hand, in a case of the manufacturing process according to the exemplary embodiment shown in FIGS. 6A to 6E, three masks 1-1 to 1-3 are used until the first electrode 150 is formed. As described above, in the case of the manufacturing method according to the exemplary embodiment, since the number of necessary masks is smaller than that of the manufacturing method according to the comparative example, the process may be simplified, thereby contributing to a cost reduction.

FIG. 8 is a plan view of a light-emitting element 300A according to still another exemplary embodiment of the present invention, FIG. 9 is a cross-sectional view taken along line A-A of FIG. 8, FIG. 10 is a plan view of the conventional light-emitting element, FIG. 11 is a cross-sectional view taken along line B-B of FIG. 10, and FIG. 12 is a conceptual view illustrating a plurality of recesses.

Referring to FIGS. 8 and 9, a light-emitting element 300A according to the exemplary embodiment includes a light-emitting structure 120 including a first conductive type semiconductor layer 122, an active layer 124, and a second conductive type semiconductor layer 126, a first bonding pad 162 electrically connected to the first conductive type semiconductor layer 122, a second bonding pad 164 electrically connected to the second conductive type semiconductor layer 126, and at least one first electrode 150 disposed between the first conductive type semiconductor layer 122 and the first bonding pad 162.

The light-emitting structure 120 is covered by an insulating layer 130, and the first bonding pad 162 and the second bonding pad 164 pass through the insulating layer 130 at points 163, 161, respectively, to be connected to the first conductive type semiconductor layer 122 and the second conductive type semiconductor layer 126, respectively.

A substrate 110 includes a conductive substrate or an insulating substrate. The substrate 110 may be a material suitable for growing a semiconductor material, or a carrier wafer. The substrate 110 may be formed of a material selected from the group consisting of sapphire, GaN, SiC, GaAs, GaN, ZnO, Si, GaP, InP and Ge, but is not limited thereto.

The light-emitting structure 120 is disposed on one surface of the substrate 110, and includes the first conductive type semiconductor layer 122, the active layer 124, and the second conductive type semiconductor layer 126. The light-emitting structure 120 may be divided into a plurality of parts in a process of cutting the substrate 110. The structure, described with reference to FIGS. 1 and 2, may be applied as it is to the first conductive type semiconductor layer 122, the active layer 124, and the second conductive type semiconductor layer 126.

The light-emitting structure 120 may include a recess CH to which the first conductive type semiconductor layer 122 is exposed through the second conductive type semiconductor layer 126 and the active layer 124. Portions of the first conductive type semiconductor layer 122 may be etched by the recess CH. The number of the recess CH may be plural. A first electrode 150 may be disposed in the recess CH to be electrically connected to the first conductive type semiconductor layer 122. A second electrode 144 may be formed under the second conductive type semiconductor layer 126.

The first electrode 150 and the second electrode 144 may include one from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SnO, InO, INZnO, ZnO, IrOx, RuOx, NiO, Ti, Al, Ni, Cr, and a selective compound or alloy thereof, and may be formed of at least one layer. A thickness of an ohmic electrode is not particularly limited.

A first insulating layer 131 may insulate the first electrode 150 from the active layer 124 and the second conductive type semiconductor layer 126. The first insulating layer 131 may be formed on an entire surface of the light-emitting structure 120 except for a region on which the first electrode 150 and the second electrode 144 are formed.

The first insulating layer 131 may include an insulating material or insulating resin formed of at least one of oxides, nitrides, fluorides, and sulfides having at least one of Al, Cr, Si, Ti, Zn, and Zr. For example, the first insulating layer 131 may selectively include among $SiO_2$, $Si_3N_4$, $Al_2O_3$, or $TiO_2$. The first insulating layer 131 may have a single layer or a multi-layer, but is not limited thereto.

A reflective layer 140 may be formed under the second electrode 144. The reflective layer 140 may be formed of a metallic or non-metallic material. The metallic reflective layer 140 may include any one of metals selected from the group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi.

A second insulating layer 132 may cover the entire light-emitting structure 120 on which the reflective layer 140 is disposed. The second insulating layer 132 may include an insulating material or insulating resin formed of at least one of oxides, nitrides, fluorides, and sulfides having at least one of Al, Cr, Si, Ti, Zn, and Zr. For example, the second insulating layer 132 may selectively include among $SiO_2$, $Si_3N_4$, $Al_2O_3$, or $TiO_2$. The second insulating layer 132 may have a single layer or a multi-layer, but is not limited thereto.

The second insulating layer 132 may be a reflective layer. Specifically, the second insulating layer 132 includes a structure in which two or more pairs of a first layer having a first refractive index and a second layer having a second refractive index are alternately stacked, and the first and second layers may be formed of a conductive or insulating material having a refractive index between 1.5 and 2.4. Such a structure may be a DBR structure. Further, it may be a structure (omnidirectional reflector) in which a dielectric layer having a low refractive index and a metal layer are stacked.

Most of the light emitted from the active layer 124 toward the second conductive type semiconductor layer 126 may be reflected toward the substrate 110 side due to such a structure. Accordingly, reflection efficiency may be increased and light extraction efficiency may be improved.

A capping layer may be further disposed between the reflective layer 140 and the second insulating layer 132. The configuration described in FIGS. 1 and 2 may be directly applied to the capping layer.

The first bonding pad 162 may be electrically connected to the first electrode 150 through the second insulating layer 132. An area of the first electrode 150 increases as the first electrode 150 approaches the substrate 110, whereas the area of the first bonding pad 162 decreases as the first bonding pad 162 approaches the substrate 110.

The second bonding pad 164 may be electrically connected to the second electrode 144 and the reflective layer 140 through the second insulating layer 132. The first bonding pad 162 and the second bonding pad 164 may include any one of metals selected from the group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi.

The first electrode 150 may be disposed in plural numbers on the first bonding pad 162. Further, the first electrode 150 may include a sub electrode 152 extending toward the second bonding pad 164. The sub electrode 152 connected to the outermost first electrode 150 may include a first region 152a extending toward the second bonding pad 164 and second regions 152b and 152c bent along a side surface of the second bonding pad 164. That is, the sub electrode 152 may not overlap the second bonding pad 164 on a plane.

The first electrode 150 and the sub electrode 152 have a Cr/Ni/Au layer structure, and the respective thicknesses thereof may be 30/100/700 nm.

The second bonding pad 164 may have a rectangular shape including four side surfaces. The second bonding pad 164 may include a first surface 160a and a second surface 160b which face each other, and a third surface 160c and a fourth surface 160d which face each other and connect the first surface 160a to the second surface 160b. A width of the second bonding pad 164 may be in a range of 400 μm to 800 μm.

The first region 152a of the sub electrode 152 may extend toward the first surface 160a. The second regions 152b and 152c may be bent in parallel with the first surface 160a and disposed between the third surface 160c and an edge 100a of the light-emitting element or between the fourth surface 160d and the edge 100a of the light-emitting element. The sub electrode 152 may have a width ranging from 10 μm to 20 μm and a thickness ranging from 0.1 μm to 1.0 μm.

As an example, a distance between the second regions 152b and 152c and the second bonding pad 164 may be smaller than a distance between the second regions 152b and 152c and the edge 100a of the light-emitting element, but is not necessarily limited thereto.

The sub electrode 152 may further include a third region 152d that is bent along the third surface 160c or the fourth surface 160d to surround the second surface 160b.

Referring to FIGS. 10 and 11, in a case in which an N-type electrode 2 adjacent the first conductive type semiconductor layer 3 is extended to be disposed on a P-type pad 1, when a crack is generated in the insulating layer 4 due to an external impact or the like, the N-type electrode 2 and the P-type pad 1 may be short-circuited to each other, thus generating a failure in the element. Further, when a crack is generated in the P-type pad 1, solder may diffuse into a chip, thus destroying chip characteristics.

In the light-emitting element according to the exemplary embodiment, the first electrode 150 and the second bonding pad 164 are disposed not to overlap each other in a thickness direction, such that a short circuit between the first electrode 150 and the second bonding pad 164 may be prevented even when the crack is generated due to the external impact or the like. Also, current dispersion efficiency may be improved so that uniform light emission may be achieved.

Referring to FIG. 12, since the recess CH and the first electrode 150 are disposed on an outer side of the light-emitting structure 120 so as not to overlap the second bonding pad, an area of the reflective layer 140 may be further secured at a central portion of the light-emitting structure 120, from which light mainly emits. That is, since the recess CH is formed on an outer side P1 of the light-emitting structure 120, it is possible to secure only separation distances d1 and d2 of one side surface adjacent to the reflective layer 140 so that the area of the reflective layer 140 may be increased.

Further, since the light mainly emits from the central portion of the light-emitting structure 120, a light absorption rate may be reduced when the first electrode 150 is formed on the outer side. Accordingly, a reflection area increases and the light absorption rate is smaller, thereby improving the light extraction efficiency.

FIG. 13 is a first modification 300B of FIG. 8, FIG. 14 is a second modification 300C of FIG. 8, and FIG. 15 shows measurement results of a light emission distribution of the light-emitting element.

Referring to FIG. 13, the sub electrode 152 may have a shape that entirely covers the side surface of the second bonding pad 164, but may have a shape that only partially covers side surfaces 160b and 160c.

Referring to FIG. 14, the first electrodes 150 may further include a branched electrode 153 protruding toward the second bonding pad 164. The sub electrode 152 may have a width ranging from 10 μm to 20 μm, and the branched electrode 153 may have a width ranging from 3 μm to 10 μm. A distance between the branched electrodes 153 which face each other may be within 600 nm.

A groove 162 may be formed in a portion of the second bonding pad 164 corresponding to the branched electrode. Accordingly, the branched electrode 153 and the second bonding pad 164 do not overlap each other on a plane. Accordingly, a short circuit due to cracks may be prevented while improving the current dispersion efficiency.

Referring to FIG. 15, it may be seen that the light emitted from the light-emitting structure according to the exemplary embodiment has uniform light distribution. Further, the first electrode 150 is disposed on an outer periphery of the light-emitting structure so that the area of the reflective layer 140 may be further secured at the central portion of the light-emitting structure 120 from which the light is mainly emitted. Accordingly, it may be seen that the light extraction efficiency is uniformly improved in both the central portion and the outer peripheral portion.

A plurality of light-emitting element packages according to the exemplary embodiment may be arrayed on a substrate, and a light guide plate, a prism sheet, a diffusing sheet, and the like, which are optical members, may be disposed on optical paths of the light-emitting element packages. The light-emitting element package, the substrate, and the optical members may serve as a backlight unit.

In addition, the light-emitting element package according to the exemplary embodiment may be applied to a display device, an indicating device, and a lighting device.

Here, the display device may include a bottom cover, a reflective plate disposed on the bottom cover, a light emitting module configured to emit light, a light guide plate disposed in front of the reflective plate and configured to guide light, which is emitted by the light emitting module, in a forward direction, an optical sheet including prism sheets disposed in front of the light guide plate, a display panel disposed in front of the optical sheet, an image signal output circuit connected to the display panel and configured to supply an image signal to the display panel, and a color filter disposed in front of the display panel. Here, the bottom cover, the reflective plate, the light emitting module, the light guide plate, and the optical sheet may form the backlight unit.

In addition, the lighting device may include a light source module including the substrate and the light-emitting element package according to the exemplary embodiment, a heat dissipation body configured to radiate heat of the light source module, and a power supplier configured to process or convert an electrical signal received from the outside and supply the signal to the light source module. For example, the lighting device may include a lamp, a head lamp, and a street light.

The head lamp may include a light emitting module including the light-emitting element packages disposed on the substrate, a reflector configured to reflect light emitted by the light emitting module in a predetermined direction, for example, a forward direction, a lens configured to refract the light reflected by the reflector in the forward direction, and a shade configured to generate a light distribution pattern, which is desired by a user, by blocking or reflecting a part of light reflected by the reflector and transmitted toward the lens.

While the embodiments have been mainly described, they are only examples but do not limit the present invention, and it may be known to those skilled in the art that various modifications and applications, which have not been described above, may be made without departing from the essential properties of the embodiments. For example, the specific components according to the embodiments may be modified. In addition, it will be interpreted that differences related to the modifications and applications fall within the scope of the present invention defined by the appended claims.

The invention claimed is:

1. A light-emitting element comprising:
a light-emitting structure including a first conductive type semiconductor layer, a second conductive type semiconductor layer, and an active layer disposed between the first conductive type semiconductor layer and the second conductive type semiconductor layer in a first direction;
a reflective layer disposed on the second conductive type semiconductor layer;
a capping layer disposed on the reflective layer;
a first electrode electrically connected to the first conductive type semiconductor layer;
an insulating layer disposed on the first electrode and the capping layer;
a first bonding pad penetrating the insulating layer and electrically connected to the first electrode; and
a second bonding pad penetrating the insulating layer and electrically connected to the capping layer, the second bonding pad spaced from the first bonding pad in a second direction different from the first direction,
wherein the light-emitting structure includes a recess extending to a partial region of the first conductive type semiconductor layer through the second conductive type semiconductor layer and the active layer,
wherein the first electrode is disposed in the recess and electrically connected to the first conductive type semiconductor layer,
wherein the first electrode includes a portion spaced from the second bonding pad in a third direction different from the first direction and the second direction,
wherein the reflective layer is disposed to be spaced apart from the recess,
and
wherein an entirety of the first electrode and the second bonding pad are disposed not to overlap each other in the first direction.

2. The light-emitting element of claim 1, wherein the capping layer includes a light-transmitting electrode.

3. The light-emitting element of claim 1, further comprising a light-transmitting electrode layer disposed between the second conductive type semiconductor layer and the reflective layer.

4. The light-emitting element of claim 3, wherein the capping layer includes a same material as the light-transmitting electrode layer.

5. The light-emitting element of claim 3, wherein the capping layer includes at least one of a transparent conductive oxide (TCO), a metal, and $SiO_2$.

6. The light-emitting element of claim 3, wherein the capping layer includes a transparent conductive oxide (TCO) and the TCO has a multi-layer structure.

7. The light-emitting element of claim 1, wherein a thermal expansion coefficient of the capping layer has a value between a thermal expansion coefficient of the reflective layer and a thermal expansion coefficient of the insulating layer.

8. The light-emitting element of claim 1, wherein a separation distance between the reflective layer and the recess is in a range of 3 μm to 30 μm.

9. The light-emitting element of claim 1, wherein the second bonding pad includes a first surface, a second surface opposite the first surface, a third surface, and a fourth surface opposite the third surface.

10. The light-emitting element of claim 9, wherein a first region of the first electrode extends toward the first surface of the second bonding pad and extends in the third direction along the first surface of the second bonding pad.

11. The light-emitting element of claim 10, wherein a second region of the first electrode extends along the third surface of the second bonding pad and the fourth surface of the second bonding pad.

12. The light-emitting element of claim 11, wherein the second region of the first electrode is disposed between the second bonding pad and a side surface of the light-emitting structure.

13. The light-emitting element of claim 12, wherein a distance between the second region of the first electrode and the second bonding pad is shorter than a distance between the second region of the first electrode and the side surface of the light-emitting structure.

14. The light-emitting element of claim 11, wherein the first electrode includes a third region connected to the second region and extends in the third direction along the second surface of the second bonding pad.

15. The light-emitting element of claim 9, wherein the first electrode is bent along respective intersections of each of the first surface, the second surface, the third surface, and the fourth surface of the second bonding pad so as to form a loop surrounding the second bonding pad.

16. The light-emitting element of claim 15, wherein the loop includes a plurality of branch electrodes protruding inwardly.

17. The light-emitting element of claim 16, wherein the second bonding pad includes a plurality of recesses corresponding to the plurality of branch electrodes.

18. A light-emitting element package comprising:
a body including a cavity; and
a light-emitting element disposed in the cavity,
wherein the light-emitting element comprises:
a light-emitting structure including a first conductive type semiconductor layer, a second conductive type semiconductor layer, and an active layer disposed between the first conductive type semiconductor layer and the second conductive type semiconductor layer in a first direction;
a reflective layer disposed on the second conductive type semiconductor layer;
a capping layer disposed on the reflective layer;
a first electrode electrically connected to the first conductive type semiconductor layer;
an insulating layer disposed on the first electrode and the capping layer;
a first bonding pad penetrating the insulating layer and electrically connected to the first electrode; and
a second bonding pad penetrating the insulating layer and electrically connected to the capping layer, the second bonding pad spaced from the first bonding pad in a second direction different from the first direction,
wherein the light-emitting structure includes a recess extending to a partial region of the first conductive type semiconductor layer through the second conductive type semiconductor layer and the active layer,
wherein the first electrode is disposed in the recess and electrically connected to the first conductive type semiconductor layer,
wherein the first electrode includes a portion spaced from the second bonding pad in a third direction different from the first direction and the second direction,
wherein the reflective layer is disposed to be spaced apart from the recess,
wherein the capping layer includes a light-transmitting electrode,
and
wherein an entirety of the first electrode and the second bonding pad are disposed not to overlap each other in the first direction.

* * * * *